United States Patent
Michiwaki et al.

(10) Patent No.: US 6,841,738 B2
(45) Date of Patent: Jan. 11, 2005

(54) PRINTED WIRING BOARD HAVING RIGID PORTION AND FLEXIBLE PORTION, AND METHOD OF FABRICATING THE BOARD

(75) Inventors: Shigeru Michiwaki, Yokohama (JP); Shinji Suga, Kawasaki (JP); Mitsuru Otsuki, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 10/441,076

(22) Filed: May 20, 2003

(65) Prior Publication Data

US 2004/0112632 A1 Jun. 17, 2004

(30) Foreign Application Priority Data

Dec. 13, 2002 (JP) .......................................... 2002-361904
Feb. 24, 2003 (JP) .......................................... 2003-045507
Mar. 28, 2003 (JP) .......................................... 2003-090301

(51) Int. Cl.[7] ................................................ H05K 1/00
(52) U.S. Cl. ........................ 174/254; 174/255; 361/795
(58) Field of Search ................................. 174/255, 254, 174/256, 258, 259, 261, 264, 266, 260; 361/749, 792, 795, 760; 439/65, 67, 493

(56) References Cited

U.S. PATENT DOCUMENTS

| | | | | |
|---|---|---|---|---|
| 3,832,769 A | * | 9/1974 | Olyphant et al. | ............. 29/830 |
| 5,262,594 A | * | 11/1993 | Edwin et al. | ................ 174/254 |
| 5,633,480 A | * | 5/1997 | Sato et al. | ................... 174/255 |
| 5,918,113 A | * | 6/1999 | Higashi et al. | ............. 438/119 |
| 6,288,343 B1 | * | 9/2001 | Ahn et al. | ................... 174/254 |

FOREIGN PATENT DOCUMENTS

| | | |
|---|---|---|
| JP | 56-71990 | 6/1981 |
| JP | 04-034993 | 2/1992 |
| JP | 05-090757 | 4/1993 |
| JP | 06-216533 | 8/1994 |
| JP | 2001-036246 | 2/2001 |

* cited by examiner

Primary Examiner—Kamand Cuneo
Assistant Examiner—I B Patel
(74) Attorney, Agent, or Firm—Lois Woo

(57) ABSTRACT

A flexible rigid printed wiring board includes a plurality of rigid wiring boards having wiring patterns. The rigid wiring boards are spatially separate from each other. The flexible rigid printed wiring board also includes a flexible portion. The flexible portion connects the rigid wiring boards, and includes an insulating and flexible resin sheet. The insulating and flexible resin sheet includes first portions of first and second sub resin sheets. The first portions of the first and second sub resin sheets are bonded together. The first and second sub resin sheets have second portions covering and adhering to surfaces of the rigid wiring boards.

8 Claims, 10 Drawing Sheets

FIG. 12
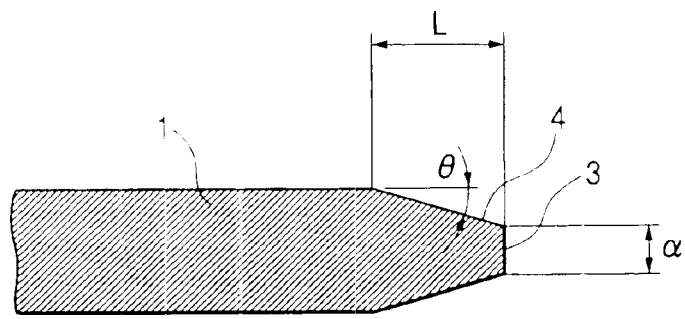
FIG. 13
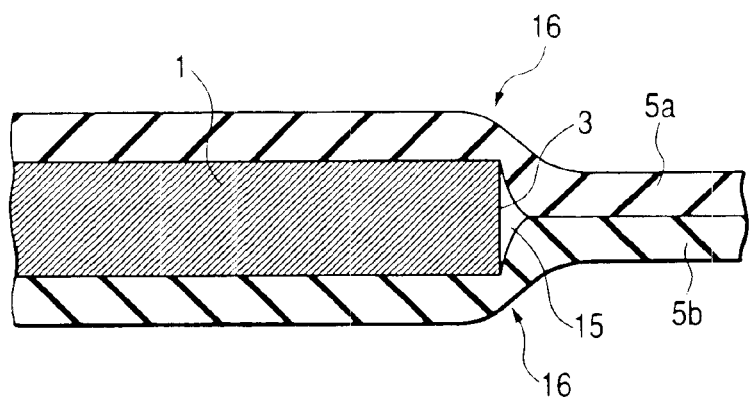
FIG. 14
| θ \ α | 0 mm | 0.2 mm | 0.3 mm | 0.4 mm | 0.6 mm |
|---|---|---|---|---|---|
| θ° (NON-CHAMFER) |  | ○ | ○ | △ | △ |
| 20° | ◎ | ◎ | ◎ | ○ | ◇ |
| 30° | ◎ | ◎ | ◎ | ○ | ◇ |
| 35° | ◎ | ◎ | ◎ | ○ | ◇ |
| 40° | ◎ | ○ | ○ | ○ | ◇ |
| 45° | ◇ | ◇ | ◇ | ◇ | ◇ |

PRINTED WIRING BOARD HAVING RIGID PORTION AND FLEXIBLE PORTION, AND METHOD OF FABRICATING THE BOARD

BACKGROUND OF THE INVENTION

1. Field of the Invention

This invention relates to a printed wiring board having at least one rigid portion and at least one flexible portion. In addition, this invention relates to a method of fabricating a printed wiring board having at least one rigid portion and at least one flexible portion.

2. Description of the Related Art

In recent years, there has been progress in downsizing electronic apparatuses and their multifunction properties. Furthermore, there have been increases in the rates of signal processing by electronic apparatuses. For advanced electronic apparatuses, it is desirable to mount electronic components on printed wiring boards at high densities.

A printed wiring board having a rigid portion and a flexible portion is referred to as a flexible rigid printed wiring board. Generally, a flexible rigid printed wiring board can be made into a desired shape. Therefore, the flexible rigid printed wiring board is useful to design a compact electronic apparatus.

The use of a flexible rigid printed wiring board in an electronic apparatus removes a connector which would be required for electric connection between separate substrates (circuit boards). The removal of the connector increases a usable space in the apparatus, and decreases a wiring length. The decreased wiring length is advantageous to a higher rate of signal processing. After electronic components are mounted on the flexible rigid printed wiring board, the board can be bent into a desired three-dimensional shape. Accordingly, the flexible rigid printed wiring board allows free layout of parts in the apparatus, and hence enables the apparatus to be downsized.

Flexible rigid printed wiring boards are of two types called "type A" and "type B" respectively.

A type-A board includes a flexible substrate, and a rigid substrate bonded to a portion of a surface of the flexible substrate. The type-A board may include a flexible substrate, and rigid substrates bonded to portions of two surfaces of the flexible substrate. An example of the rigid substrate or substrates is "FR-4".

A type-B board includes a flexible substrate having a portion provided with a multilayer structure. The multilayer portion is properly rigid so that a desired wiring pattern can be formed thereon.

It is known to form buildup layers on one or two surfaces of a rigid portion of a type-A board or a type-B board. The buildup layers constitute a multilayer structure.

Japanese patent application publication number 04-034993/1992 shows a type-A board. Specifically, Japanese application 04-034993/1992 discloses the manufacture of a multilayer printed wiring board having a flexible portion. According to Japanese application 04-034993/1992, a flexible printed wiring board uses a flexible polyimide film as a base film. The flexible polyimide film has a circuit pattern formed as follows. Copper foil is affixed to a surface of an original polyimide film. The copper foil is etched to form the circuit pattern. A first hard printed wiring board, a first adhesive sheet, a circuit protective sheet, the flexible printed wiring board, a second adhesive sheet, and a second hard printed wiring board are sequentially superposed into a laminate. The laminate is pressed and heated so that the layers therein are bonded together to form a single body.

In Japanese application 04-034993/1992, the circuit protective film includes a polyimide film, and an acrylic-epoxy adhesive layer provided on a surface of the polyimide film which will adjoin the flexible printed wiring board. Each of the first and second adhesive sheets includes a polyimide film, and acrylic-epoxy adhesive layers provided on two surfaces of the polyimide film respectively. Each of the adhesive sheets has a previously-formed opening at a place corresponding to a flexible portion of an end product, that is, a multilayer printed wiring board. Each of the first and second hard printed wiring boards includes a glass-imide resin plate, and copper foil affixed to a surface of the glass-imide resin plate which will be an outer surface of the end product. The other surface of the glass-imide resin plate, which will adjoin the first or second adhesive sheet, has a previously-formed groove in alignment with the opening in the related adhesive sheet.

In Japanese application 04-034993/1992, after the layers in the laminate are bonded together, the copper foil of each of the first and second hard printed wiring boards is etched and portions of the hard printed wiring boards which define through holes are plated to form desired circuit patterns thereon. Then, the outer surfaces of the hard printed wiring boards are provided with openings which reach the grooves therein. The openings in the hard printed wiring boards, and the openings in the adhesive sheets cause the flexible portion of the end product.

Japanese patent application publication number 05-090757/1993 shows a type-B board. Specifically, Japanese application 05-090757/1993 discloses a multilayer flexible printed wiring board including a first multilayer portion, a second multilayer portion, and a flexible portion extending between the first and second multilayer portions. Each of the multilayer portions has a laminate of an upper flexible printed wiring board, an upper adhesive sheet, an intermediate flexible printed wiring board, a lower adhesive sheet, and a lower flexible printed wiring board which are sequentially arranged in that order. The flexible portion has a laminate of an upper flexible printed wiring board, an adhesive sheet, and a lower flexible printed wiring board which are sequentially arranged in that order. The upper flexible printed wiring board in the flexible portion is integral with the upper flexible printed wiring boards in the multilayer portions. The adhesive sheet in the flexible portion is integral with the upper adhesive sheets in the multilayer portions. The lower flexible printed wiring board in the flexible portion is integral with the intermediate flexible printed wiring boards in the multilayer portions.

The multilayer flexible printed wiring board in Japanese application 05-090757/1993 has a recess located between the first and second multilayer portions. The bottom of the recess is defined by the flexible portion. Thus, the flexible portion is thinner than the multilayer portions.

To fabricate the multilayer printed wiring board (the type-A board) in Japanese application 04-034993/1992, it is necessary to previously make a hard printed wiring board and a flexible printed wiring board by different steps respectively. Then, first, second, and third steps are required. The first step is to bond the hard printed wiring board and the flexible printed wiring board together by using an adhesive layer. The second step is to provide through holes for electrical connection between separate conductor layers. The third step is to pattern a surface-layer conductor with a circuit. Accordingly, a relatively large number of steps are required to complete the multilayer printed wiring board. It is necessary to use an installation for making hard printed wiring boards and also an installation for making flexible printed wiring boards. Therefore, the cost of the production of the multilayer printed wiring board is relatively high.

In the multilayer printed wiring board of Japanese application 04-034993/1992, the material for the hard printed wiring boards, the material for the flexible printed wiring board, and the material for the adhesive layers differ from each other, and have different coefficients of thermal expansion. The different thermal expansion coefficients have a chance of causing the following problems in the presence of a temperature load or a temperature change. Conditions of the connection of plating to the walls defining through holes are made uneven. Exfoliation occurs in connecting portions. Wiring patterns in different layers are misaligned. Warp of the multilayer printed wiring board is relatively great.

As previously mentioned, the multilayer flexible printed wiring board (the type-B board) in Japanese application 05-090757/1993 includes the flexible printed wiring boards and the adhesive sheets. In general, material for such flexible printed wiring boards and material for such adhesive sheets differ from each other, and have different coefficients of thermal expansion. The different thermal expansion coefficients have a chance of causing the following problems in the presence of a temperature load or a temperature change. Conditions of the connection of plating to the walls defining through holes are made uneven. Exfoliation occurs in connecting portions. Wiring patterns in different layers are misaligned. Warp of an end-product board is relatively great.

The multilayer flexible printed wiring board (the type-B board) in Japanese application 05-090757/1993 tends to be considerably lower in hardness than a typical rigid board. Therefore, in some cases, it is necessary to support one side of the multilayer flexible printed wiring board by a suitable plate when electronic components are mounted on the other side of the board.

SUMMARY OF THE INVENTION

It is a first object of this invention to provide an inexpensive printed wiring board having at least one rigid portion and at least one flexible portion.

It is a second object of this invention to provide an inexpensive method of fabricating a printed wiring board having at least one rigid portion and at least one flexible portion.

It is a third object of this invention to provide a printed wiring board having at least one rigid portion and at least one flexible portion which is substantially free from warp, and in which conditions of the connection of plating to the walls are uniform and exfoliation is absent from connecting portions, and wiring patterns in different layers are aligned.

It is a fourth object of this invention to provide a method of fabricating a printed wiring board having at least one rigid portion and at least one flexible portion which prevents conditions of the connection of plating to the walls from being made uneven, which prevents exfoliation from occurring in connecting portions, which prevents wiring patterns in different layers from being misaligned, and which prevents an end-product board from being warped as a result of a temperature load or a temperature change.

A first aspect of this invention provides a flexible rigid printed wiring board comprising a plurality of rigid wiring boards having wiring patterns and being spatially separate from each other; and a flexible portion connecting the rigid wiring boards and including an insulating and flexible resin sheet; wherein the insulating and flexible resin sheet includes first portions of first and second sub resin sheets, and the first portions of the first and second sub resin sheets are bonded together, and wherein the first and second sub resin sheets have second portions covering and adhering to surfaces of the rigid wiring boards.

A second aspect of this invention is based on the first aspect thereof, and provides a flexible rigid printed wiring board wherein an edge of each of the rigid wiring boards, which adjoins the flexible portion, has a chamfer.

A third aspect of this invention is based on the second aspect thereof, and provides a flexible rigid printed wiring board wherein the chamfer has a prescribed angle "θ" relative to a major surface of the related rigid wiring board, and the edge of each of the rigid wiring boards has a non-chamfered end surface portion with a prescribed thickness-wise width "α", and wherein the angle "θ" is equal to or less than 35°, and the width "α" is equal to or less than 0.3 mm.

A fourth aspect of this invention is based on the first aspect thereof, and provides a flexible rigid printed wiring board wherein at least one of the first and second sub resin sheets includes a laminate of resin layers.

A fifth aspect of this invention is based on the first aspect thereof, and provides a flexible rigid printed wiring board further comprising a wiring pattern provided on at least one of the first and second sub resin sheets and electrically connecting the wiring patterns on the rigid wiring boards.

A sixth aspect of this invention is based on the first aspect thereof, and provides a flexible rigid printed wiring board wherein at least one of the first and second sub resin sheets is made of epoxy-based resin.

A seventh aspect of this invention is based on the first aspect thereof, and provides a flexible rigid printed wiring board wherein at least one of the first and second sub resin sheets is made of polyolefin-based resin.

An eighth aspect of this invention is based on the first aspect thereof, and provides a flexible rigid printed wiring board wherein at least one of the first and second sub resin sheets is made of polyimide-based resin.

A ninth aspect of this invention provides a method of fabricating a flexible rigid printed wiring board. The method comprises the steps of providing an opening in a rigid wiring board having a prescribed shape, the opening corresponding to a flexible portion of the flexible rigid printed wiring board; coating surfaces of the rigid wiring board with first and second resin sheets respectively, the first and second resin sheets having portions extending in and over the opening in the rigid wiring board; and bonding the first and second resin sheets together in the opening in the rigid wiring board.

A tenth aspect of this invention is based on the ninth aspect thereof, and provides a method wherein the first and second resin sheets are made of one selected from a group of epoxy-based resin, polyolefin-based resin, and polyimide-based resin.

An eleventh aspect of this invention is based on the ninth aspect thereof, and provides a method wherein the first and second resin sheets are in a semihard state during the coating step.

A twelfth aspect of this invention is based on the ninth aspect thereof, and provides a method wherein the bonding step comprises pressing the first and second resin sheets against each other to bond the first and second resin sheets together, and heating and thereby fully curing the first and second resin sheets.

BRIEF DESCRIPTION OF THE DRAWINGS

FIG. 12 is a sectional view of a portion of a multilayer board in the first embodiment of this invention.

FIG. 13 is a sectional view of portions of a multilayer board and resin sheets in an assumed flexible rigid printed wiring board.

FIG. 14 is a diagram of the results of evaluation about the abilities of samples of flexible rigid printed wiring boards to endure repetitive bending processes, the samples including multilayer boards having several different values in chamfer angle "θ" and thickness-wise width "α".

DETAILED DESCRIPTION OF THE INVENTION

First Embodiment

A flexible rigid printed wiring board (a printed wiring board having a flexible portion and a rigid portion or portions) in a first embodiment of this invention includes flexible and bendable sheets made of insulating resin material. First portions of the sheets form the flexible portion of the board. Second and third portions of the sheets constitute insulating layers being buildup layers extending in the rigid portions of the board. The sheets can bend or fold at an angle including an acute angle and an obtuse angle. Furthermore, the sheets can curve.

The sheets are made of suitable resin which is flexible and bendable even after falling into a fully cured state (a C-stage state). The fully cured state means a final state in which the structure of the resin is stable. Examples of the resin are epoxy resin, epoxy-based resin, polyolefin resin, polyolefin-based resin, polyimide resin, and polyimide-based resin.

When the flexible rigid printed wiring board is designed for general use, it is preferable to make the sheets of epoxy-based resin having well-balanced physical properties. In the case where the flexible portion and the rigid portions of the board are made of epoxy-based resin, they are equal in coefficient of thermal expansion. Therefore, in this case, it is possible to prevent conditions of the connection of plating to the walls from being made uneven, to prevent exfoliation from occurring in connecting portions, to prevent wiring patterns in different layers from being misaligned, and to prevent the end-product board from being warped as a result of a temperature load or a temperature change.

To suppress an electric loss in the flexible rigid printed wiring board, it is preferable to make the sheets of polyolefin-based resin having a low tan δ characteristic (a low dielectric loss tangent). In the case where the flexible rigid printed wiring board is used while being repetitively bent, it is preferable to make the sheets of polyimide-based resin excellent in bending performance.

Figure 1:
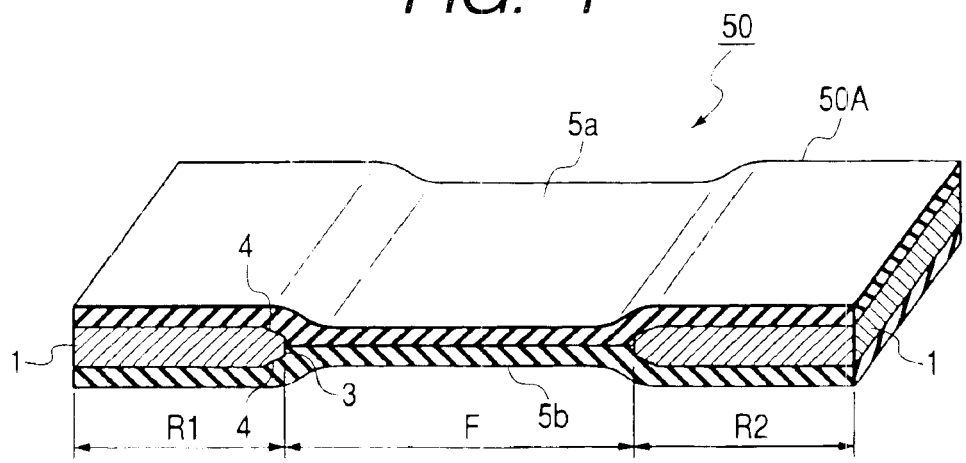
FIG. 1 is a perspective view, partially in section, of a flexible rigid printed wiring board according to a first embodiment of this invention.

FIG. 1 shows the flexible rigid printed wiring board in the first embodiment of this invention which is denoted by the reference numeral "50". As shown in FIG. 1, the flexible rigid printed wiring board 50 has a prescribed shape 50A. The flexible rigid printed wiring board 50 includes a first rigid portion R1, a second rigid portion R2, and a flexible portion F extending between the rigid portions R1 and R2. The flexible portion F connects the rigid portions R1 and R2. The first rigid portion R1 forms a first rigid printed wiring board. The second rigid portion R2 forms a second rigid printed wiring board.

The flexible rigid printed wiring board 50 includes a first insulating resin sheet 5a and a second insulating resin sheet 5b extending in and over the flexible portion F and the rigid portions R1 and R2. The resin sheets 5a and 5b are flexible.

Each of the rigid portions (the rigid printed wiring boards) R1 and R2 contains a multilayer board 1 sandwiched between the resin sheets 5a and 5b. The multilayer board 1 is also referred to as the multilayer substrate 1, the rigid board 1, or the rigid substrate 1. In the rigid portions R1 and R2, the resin sheets 5a and 5b adhere to opposite major surfaces of each of the multilayer boards 1 respectively. Each of the multilayer boards 1 terminates at the boundary between the related rigid portion (R1 or R2) and the flexible portion F. The resin sheets 5a and 5b directly contact each other and are bonded together in the flexible portion F. The resin sheets 5a and 5b may be substantially integral with each other in the flexible portion F.

Wiring patterns are formed on the resin sheets 5a and 5b. Portions of the wiring patterns on the resin sheets 5a and 5b constitute wiring patterns on the flexible portion F. The rigid printed wiring boards (the rigid portions) R1 and R2 have wiring patterns, respectively. The wiring pattern on the first rigid printed wiring board R1 and the wiring pattern on the second rigid printed wiring board R2 are electrically connected by those on the flexible portion F.

Each of the multilayer boards 1 has an edge or end 3 extending along the boundary between the related rigid portion (R1 or R2) and the flexible portion F. Upper and lower corners of each of the multilayer boards 1 at its end 3 are beveled or chamfered to form inclined surfaces 4.

Figure 2:
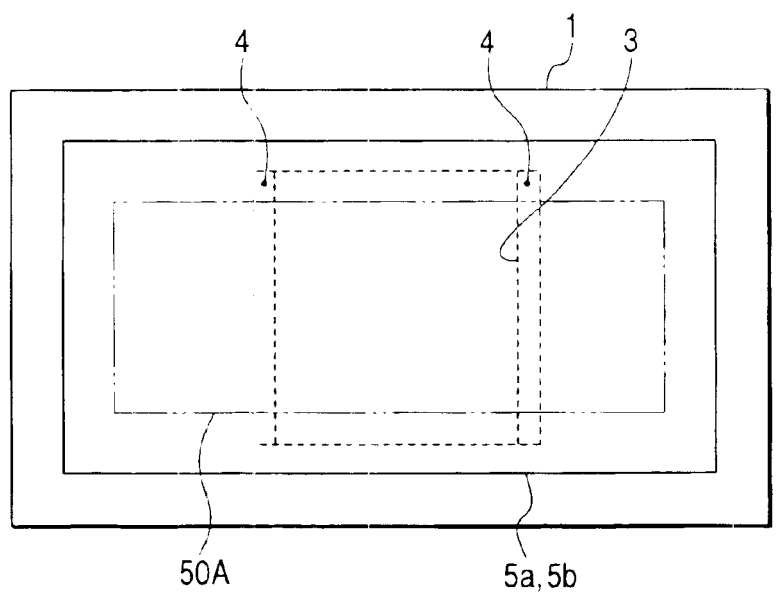
FIG. 2 is a plan view of an intermediate-product body which occurs during the fabrication of the flexible rigid printed wiring board in the first embodiment of this invention.
Figure 3:
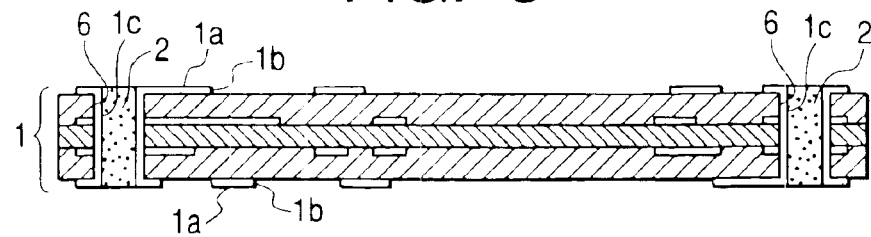
FIGS. 3–11 are sectional views of intermediate-product bodies which occur at different stages during the fabrication of the flexible rigid printed wiring board in the first embodiment of this invention.

A method of fabricating the flexible rigid printed wiring board 50 will be described below. The flexible rigid printed wiring board 50 is also referred to as the end product 50. With reference to FIGS. 2 and 3, a rigid substrate (a rigid board) 1 is prepared. The rigid substrate 1 uses a multilayer board. A board having two surfaces coated with copper layers may be used instead of the multilayer board. For example, the multilayer board 1 includes an FR-4 board having first and second copper-clad surfaces, a first layer superposed on the first surface of the FR-4 board, and a second layer superposed on the second surface of the FR-4 board. The multilayer board 1 has two major surfaces (upper and lower surfaces) on which copper foil layers 1a are formed respectively. The multilayer board 1 has a thickness of, for example, 0.4 mm. Each of the copper foil layers 1a has a thickness of, for example, 12 $\mu$m.

The rigid board 1 may be of a non-laminar type. The multilayer board 1 may have an arbitrary number of layers. The rigid board 1 or the multilayer board 1 may have previously-made wiring patterns and inner via holes.

The method of fabricating the flexible rigid printed wiring board 50 includes steps S1 to S11 which are executed after the multilayer board 1 has been prepared.

In the step S1, inner via holes 6 are formed through the multilayer board 1 by drilling. The inner via holes 6 have a diameter of, for example, 0.3 mm.

In the step S2 which follows the step S1, the two major surfaces of the multilayer board 1 are slightly buffed to remove burr from portions at ends of the inner via holes 6.

In the step S3 which is subsequent to the step S2, the multilayer board 1 is subjected to chemical copper plating and copper electroplating so that copper layers 1c are formed on the surfaces of board walls which define the inner via holes 6. The copper layers 1c provide electrical connection between the copper foil layers 1a on the two major surfaces of the multilayer board 1. The copper layers 1c have a thickness of, for example, about 20 $\mu$m.

In the step S4 which follows the step S3, the inner via holes 6 are filled with resin 2.

The step S5 is subsequent to the step S4. In the step S5, the copper foil layers 1a on the two major surfaces of the multilayer board 1 are processed into prescribed wiring patterns 1b by photolithography which includes etching (see FIG. 3).

Figure 4:
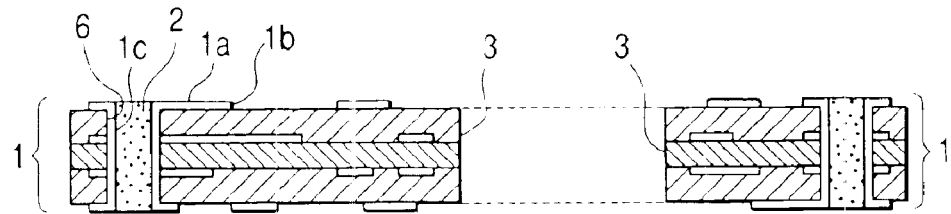

In the step S6 which follows the step S5, a portion corresponding to the flexible portion F is removed from the multilayer board 1 by a router so that a rectangular opening 3 is formed through the multilayer board 1 as shown in FIGS. 2 and 4. The opening 3 will provide the interval between the rigid wiring boards (the rigid portions) R1 and R2 of the end product 50. Edges of the opening 3 correspond to ends or edges of the multilayer boards 1 in the end product 50 (see FIG. 1).

Figure 5:
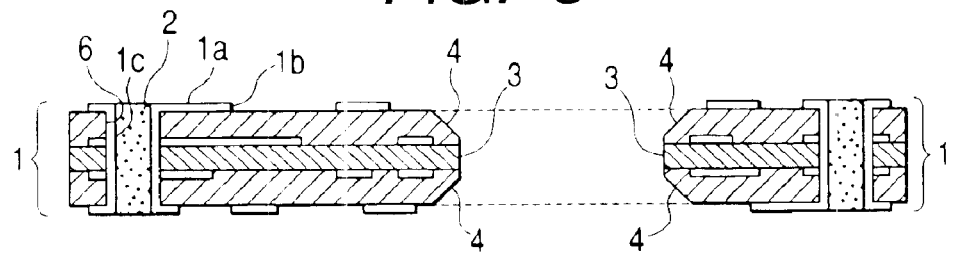

In the step S7 which is subsequent to the step S6, as shown in FIGS. 2 and 5, upper and lower corners of the walls of the multilayer board 1 which define upper and lower ends of the opening 3 are beveled or chamfered to form inclined surfaces 4. The beveling or chamfering is implemented by a router including a blade having a prescribed edge angle. Thus, the angle of the inclined surfaces 4 relative to the major surfaces (the upper and lower surfaces) of the multilayer board 1 is equal to a given value.

The step S8 follows the step S7. In the step S8, the exposed surfaces of the wiring patterns 1b are blackened to provide better adhesion for layers (resin sheets 5a and 5b) which will be formed thereon at a later step.

In the step S9 which is subsequent to the step S8, epoxy-based resin sheets 5a and 5b in a semihard state or a B-stage state are respectively superposed on the major surfaces of the multilayer board 1 which have the wiring patterns 1b (see FIG. 2). The resin sheets 5a and 5b are flexible and bendable after being fully cured. The resin sheets 5a and 5b cover the wiring patterns 1b on the multilayer board 1. The resin sheets 5a and 5b have a thickness of, for example, 70 $\mu$m. It should be noted that the sheets 5a and 5b may be made of polyolefin-based resin or polyimide-based resin in a semihard state which will be flexible and bendable after being fully cured.

Figure 6:
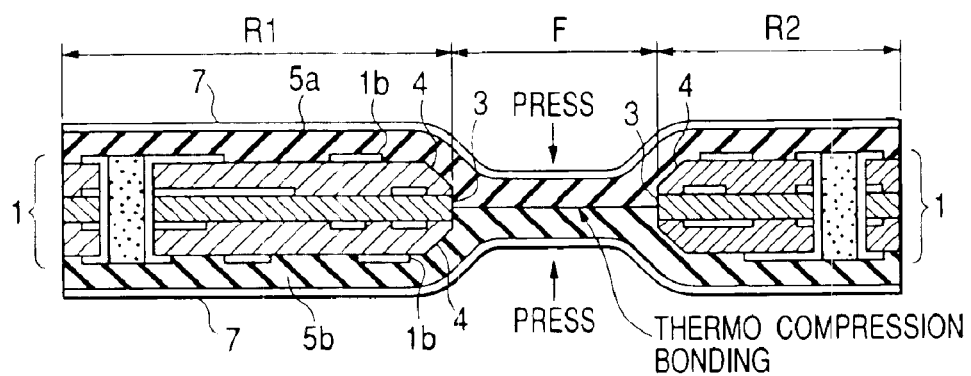

In the step S10 which follows the step S9, copper foil sheets 7 are superposed on the resin sheets 5a and 5b respectively. The copper foil sheets 7 are also referred to as the copper foil layers 7. One of two surfaces of each of the copper foil sheets 7 is rugged. The rugged surface of each of the copper foil sheets 7 adjoins the related resin sheet 5a or 5b. In the step S10, the resin sheets 5a and 5b with the copper foil sheets 7 are pressed inward by a vacuum laminator (not shown) while being heated. Thus, as shown in FIG. 6, the resin sheets 5a and 5b are forced into the opening 3, being brought into contact with each other in the opening 3 and being pressed against each other therein. Accordingly, the resin sheets 5a and 5b are bonded together in the opening 3 by a thermo compression bonding procedure. At the present stage (see FIG. 6), a flexible portion F and rigid portions R1 and R2 are defined in an intermediate product. The flexible portion F corresponds in position to the opening 3. The rigid portions R1 and R2 correspond in position to the multilayer board 1 extending outside the opening 3. At the present stage (see FIG. 6), the thickness of the resin sheets 5a and 5b which is measured from the surfaces of the wiring patterns 1b is equal to, for example, about 50 $\mu$m. The thickness of the copper foil sheets 7 is equal to, for example, 12 $\mu$m.

In the step S10, it is preferable to implement the press of the resin sheets 5a and 5b by use of a diaphragm of hard rubber with an internal pressure raised by compressed air. In this case, the resin sheets 5a and 5b in the opening 3 can be sufficiently pressed. Preferably, the heating in the step S10 is at a temperature of 120° C. regardless of whether the material for the resin sheets 5a and 5b is epoxy-based resin, polyolefin-based resin, or polyimide-based resin. Preferably, the press in the step S10 is at a pressure of 7 kg/cm$^2$ regardless of whether the material for the resin sheets 5a and 5b is epoxy-based resin, polyolefin-based resin, or polyimide-based resin.

In the step S11 which follows the step S10, the resin sheets 5a and 5b on the multilayer board 1 are fully cured by heat treatment. Preferable conditions of the heat treatment are as follows. In the case where the material for the resin sheets 5a and 5b is epoxy-based resin, the heat treatment is executed for 60 minutes at a temperature of 180° C. In the case where the material for the resin sheets 5a and 5b is polyolefin-based resin, the heat treatment is executed for 60 minutes at a temperature of 170° C. In the case where the material for the resin sheets 5a and 5b is polyimide-based resin, the heat treatment is executed for 60 minutes at a temperature of 200° C. As a result of the full cure, the resin sheets 5a and 5b adhere to the multilayer board 1 and become buildup insulating layers forming a single body together with the multilayer board 1. At least portions of the wiring patterns 1b on the multilayer board 1 are coated and insulated with the resin sheets 5a and 5b. The superposition and adhesion of the resin sheets 5a and 5b on and to the multilayer board 1 are referred to as "a coating process".

During the step S11, the resin sheets 5a and 5b in the region corresponding to the flexible portion F are fully cured. The resin sheets 5a and 5b are flexible and bendable after being fully cured. It is preferable that during the execution of the heat treatment in the step S11, the multilayer board 1 is held erected by a suitable support device such as a support jig. In this case, the resin sheets 5a and 5b in the opening 3 of the multilayer board 1 are prevented from sagging under their own weights.

As a result of the steps S1 to S11, an intermediate-product body is made. The intermediate-product body includes the multilayer board 1 and the resin sheets 5a and 5b. The resin sheets 5a and 5b are superposed on the two major surfaces of the multilayer board 1 as buildup insulating layers. The outer surfaces of the resin sheets 5a and 5b are provided with the copper foil sheets 7. The intermediate-product body has a flexible portion F and rigid portions R1 and R2. The flexible portion F of the intermediate-product body is formed by portions of the resin sheets 5a and 5b which extend in the opening 3 of the multilayer board 1. The rigid portions R1 and R2 of the intermediate-product body include the multilayer board 1 and portions of the resin sheets 5a and 5b which extend outside the opening 3 in the multilayer board 1.

The method of fabricating the flexible rigid printed wiring board 50 further includes steps S12 to S17.

Figure 7:
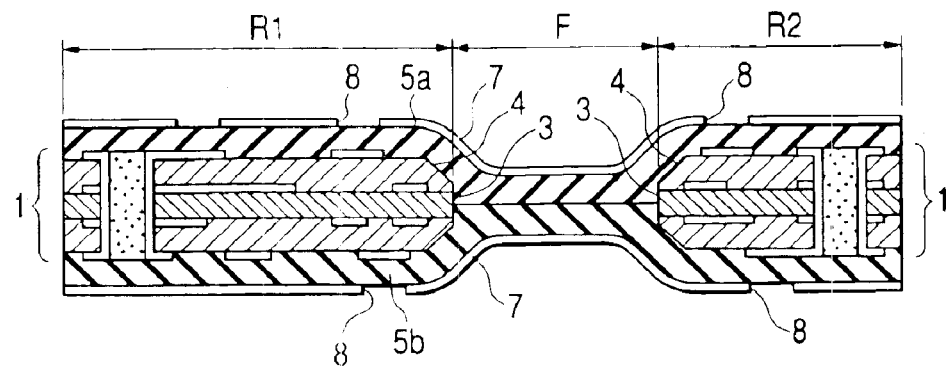

The step S12 follows the step S11. In the step S12, the copper foil layers 7 on the resin sheets 5a and 5b are processed by photolithography which includes etching. The photolithography is designed to remove portions from the copper foil layers 7 which extend in places where laser blind via holes will be provided. Thus, the photolithography processes the copper foil layers 7 into conformal masks 8 as shown in FIG. 7.

Figure 8:
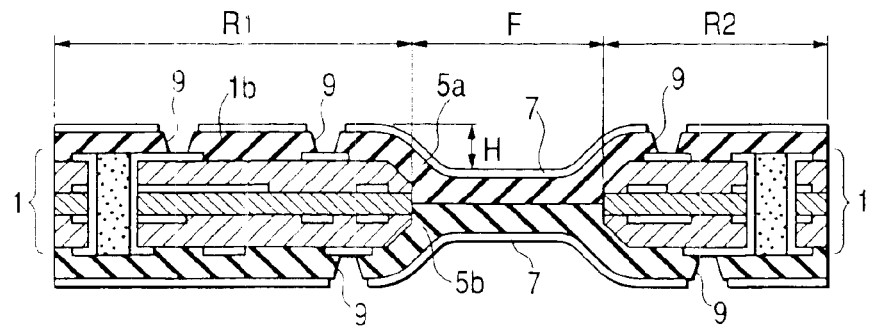

In the step S13 which is subsequent to the step S12, as shown in FIG. 8, via holes 9 are provided in the resin sheets 5a and 5b by laser-based processing. The via holes 9 reach the wiring patterns 1b on the multilayer board 1. The top diameter of the laser-based processing (the diameter of apertures in the conformal masks 8) is equal to, for example, 150 $\mu$m.

Figure 9:
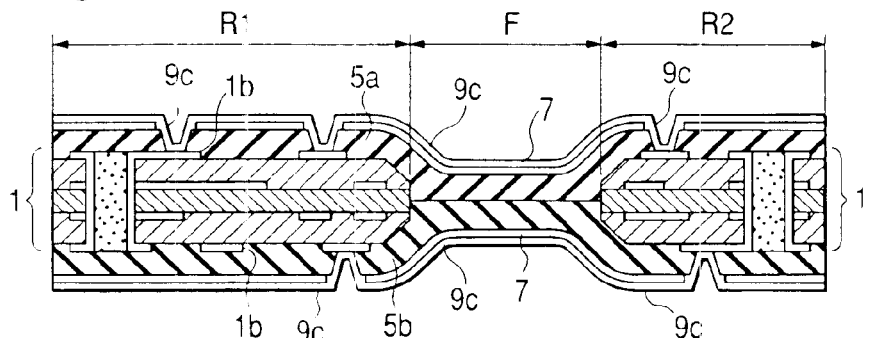

In the step S14 which follows the step S13, the intermediate-product body is subjected to chemical copper plating and copper electroplating. Therefore, as shown in FIG. 9, the exposed surfaces of the intermediate-product body are coated with copper layers 9c. Thus, the surfaces of the intermediate-product body which define the via holes 9 are covered with the copper layers 9c. The copper layers 9c extending in the via holes 9 provide electrical connection between the wiring patterns 1b on the multilayer board 1 and the copper foil layers 7 on the resin sheets 5a and 5b. The copper layers 9c have a thickness of, for example, about 20 $\mu$m. Portions of the copper layers 9c extend over the copper foil layers 7. The superposition of each copper layer 9c and each copper foil layer 7 is equal to, for example, about 32 $\mu$m in thickness.

The step S15 follows the step S14. In the step S15, the outer-layer conductors on the intermediate-product body which include the copper layers 9c and the copper foil layers 7 are subjected to patterning. As shown in FIG. 8, there is an about 0.15-mm difference H in level between the upper surface of the flexible portion F and the upper surface of each of the rigid portions R1 and R2. There is a similar level difference H between the lower surface of the flexible portion F and the lower surface of each of the rigid portions R1 and R2. These level differences H are caused by pressing the resin sheets 5a and 5b into the opening 3 in the multilayer board 1. It is preferable that the patterning employs liquid photoresist of an electrodeposition type which can follow roughness caused by the level differences H. For example, "Zonne EDUV376" produced by Kansai Paint Co., Ltd. can be used as such photoresist.

During the patterning in the step S15, photoresist is provided on the surfaces of the outer-layer conductors by electrodeposition. Thereafter, the intermediate-product body with the photoresist is subjected to exposure via pattern films for prescribed conductor patterns. The pattern films contact the rigid portions R1 and R2. Preferably, the exposure is implemented by a projection aligner having a great depth of field. In this case, even when the pattern films are separate from the flexible portion F due to the presence of the steps H, good exposure focus is available to the flexible portion F. Thus, in this case, fine patterns can be formed on not only the rigid portions R1 and R2 but also the flexible portion F.

Figure 10:
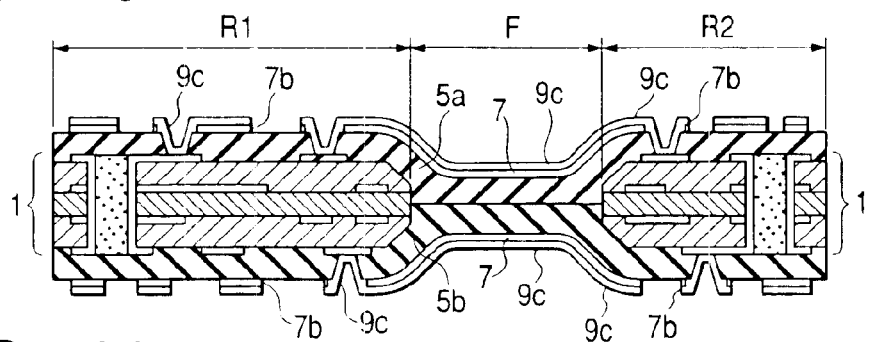

In the step S115, after the exposure by the aligner, the intermediate-product body is subjected to development and etching so that wiring patterns 7b are formed on the flexible portion F and the rigid portions R1 and R2 as shown in FIG. 10. The wiring patterns 7b on the flexible portion F have a line width of, for example, 100 $\mu$m and a space width of, for example, 100 $\mu$m. The wiring patterns 7b on the rigid portions R1 and R2 have a line width of, for example, 75 $\mu$m and a space width of, for example, 75 $\mu$m.

It should be noted that the exposure in the step S15 may be implemented by a laser direct image system using a laser beam.

Figure 11:
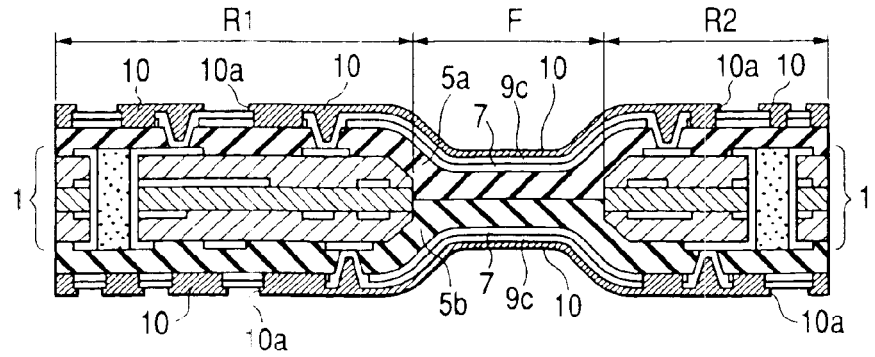

The step S16 follows the step S15. In the step S16, as shown in FIG. 11, solder resist layers 10 are formed on the exposed surfaces of the intermediate-product body by a laminator (a laminating machine). During the step S16, the solder resist layers 10 are processed into prescribed patterns by etching which uses photoresists. The prescribed patterns have openings 10a. The solder resist layers 10 act as cover lays or protective layers in the flexible portion F.

The material for the solder resist layers 10 can use cover lay material for an ordinary flexible board which is bendable and photosensitive. Preferably, the laminator used in the step S16 is of a vacuum type. Preferably, the solder resist layers 10 are patterned by a projection aligner. As previously mentioned, the resultant resist layers 10 have openings 10a.

In the step S17 which is subsequent to the step S16, the intermediate-product body is cut into a prescribed shape 50A by machining so that a flexible rigid printed wiring board 50 is completed (see FIGS. 1 and 2).

As understood from the previous description, the flexible portion F and the rigid portions R1 and R2 of the flexible rigid printed wiring board 50 can be made by a sequence of steps using a common manufacturing installation. This is advantageous to a reduction in production cost.

The wiring patterns 1b on the multilayer boards 1 in the rigid portions R1 and R2 are electrically connected via wiring patterns including the wiring patterns on the flexible portion F. In each of the rigid portions R1 and R2, the wiring patterns can easily be aligned.

The method of fabricating the flexible rigid printed wiring board 50 will be further described hereafter. In the step S10, the resin sheets 5a and 5b with the copper foil sheets 7 are subjected to the thermo compression bonding procedure by the vacuum laminator (see FIG. 6). During the thermo compression bonding procedure, the copper foil sheets 7 prevent the material for the resin sheets 5a and 5b from considerably dropping in viscosity and undesirably flowing due to a temperature rise. Therefore, the resultant resin sheets 5a and 5b have a sufficient thickness.

It should be noted that the thermo compression bonding procedure may be replaced by another way of bonding the resin sheets 5a and 5b together.

As previously mentioned, in the step S7, the upper and lower corners of the walls of the multilayer board 1, which extend in places corresponding to the boundaries between the flexible portion F and the rigid portions R1 and R2, are beveled or chamfered to form the inclined surfaces 4 (see FIG. 5). The inclined surfaces 4 suppress abrupt changes in thickness of the resin sheets 5a and 5b at the boundaries between the flexible portion F and the rigid portions R1 and R2. In addition, the inclined surfaces 4 alleviate the concentration of stress on the boundaries. Therefore, the boundaries between the flexible portion F and the rigid portions R1 and R2 have an improved ability to endure repetitive bending processes.

With reference to FIG. 12, a chamfer angle "θ" is defined as an angle between each inclined surface 4 and a related major surface of a multilayer board (a rigid substrate) 1. In FIG. 12, the multilayer board 1 has a non-chamfered end surface with a thickness-wise width "α". The thickness-wise width "α" means the dimension of the non-chamfered end surface which is measured along the direction of thickness of the multilayer board 1. The non-chamfered end surface extends between the upper and lower inclined surfaces 4. In FIG. 12, the character "L" denotes the dimension of each inclined surface 4 which is measured along a direction parallel with the related major surface of the multilayer board 1. In other words, the character "L" denotes the domain, parallel with the related major surface of the multilayer board 1, in which the inclined surface 4 extends.

As shown in FIG. 13, a non-chamfered multilayer board 1 is assumed. The assumed non-chamfered multilayer board 1 has a thickness of 0.6 mm. As shown in FIG. 13, the assumed non-chamfered multilayer board 1 has an opening 3. Resin sheets 5a and 5b have portions superposed on the assumed non-chamfered multilayer board 1, and other portions extending in the opening 3 therein. The resin sheets 5a and 5b abruptly curve at the edge of the opening 3 in the assumed non-chamfered multilayer board 1, and are bonded together in the opening 3. The resin sheets 5a and 5b are in a semihard state or a B-stage state before they are bonded together by a thermo compression bonding procedure. Although the shapes of the resin sheets 5a and 5b thus follow the shape of the multilayer board 3 to a certain degree before being fully cured, perfect shape conformity is unavailable and a gap 15 probably occurs among the assumed non-chamfered multilayer board 1 and the resin sheets 5a and 5b at the edge of the opening 3. As shown in FIG. 13, portions of the resin sheets 5a and 5b which abruptly curve at the edge of the opening 3 are provided with shoulders 16. The resin sheets 5a and 5b tend to be thin at the shoulders 16. Regarding the assumed non-chamfered multilayer board 1, the thin portions of the resin sheets 5a and 5b reduce their abilities to endure repetitive bending processes.

About beveling or chamfering the upper and lower corners of each of the multilayer boards 1 to form the inclined surfaces 4 at its end 3, the inventors have found the following facts. As a result of the beveling or chamfering, the ability of the resin sheets 5a and 5b to endure the repetitive bending processes can be uniformly provided regardless of position on the resin sheets 5a and 5b. There are limits of ranges of the chamfer angle "θ" and the thickness-wise width "α" in which acceptable uniformity in the ability to endure the repetitive bending processes is available.

Samples of the flexible rigid printed wiring board 50 were made. The samples differed from each other in multilayer-board thickness "t", chamfer angle "θ", and thickness-wise width "α". Specifically, the thicknesses "t" of multilayer boards (rigid substrates) 1 in the samples were 0.2 mm, 0.3 mm, 0.4 mm, 0.6 mm, and 0.8 mm. The chamfer angles "θ" in the samples were 0°, 20°, 30°, 35°, 40°, and 45°. The thickness-wise widths "α" in the samples were 0 mm, 0.2 mm, 0.3 mm, 0.4 mm, and 0.6 mm.

The abilities of the samples to endure repetitive bending processes were evaluated. The results of the evaluation are shown in FIG. 14 where the characters "⊚" denote "very excellent"; the characters "○" denote "excellent"; the characters "◇" denote "highly good"; and the characters "Δ" denote "good". Here, "very excellent", "excellent", "highly good", and "good" are sequentially arranged in the order from high ability toward low ability. Even "good" abilities are sufficient in practical use.

In FIG. 14, a chamfer angle "θ" equal to 0° corresponds to samples containing non-chamfered multilayer boards 1. On the other hand, chamfer angles "θ" between 20° and 45° correspond to samples containing chamfered multilayer boards 1 having thicknesses greater than their thickness-wise widths "α". For example, the evaluation result "⊚" at a chamfer angle "θ" of 30° and a thickness-wise width "α" of 0.3 mm in FIG. 14 corresponds to three samples containing multilayer boards 1 having thicknesses equal to or greater than 0.4 mm.

It is understood from FIG. 14 that the chamfer-improved ability of a flexible rigid printed wiring board 50 to endure repetitive bending processes is substantially independent of the thickness of multilayer boards (rigid substrate) 1 therein.

FIG. 14 shows that evaluation results about samples containing multilayer boards 1 having chamfer angles "θ" between 20° and 40° are equal to or better than those about samples containing non-chamfered multilayer boards 1. Therefore, it is preferable to bevel or chamfer multilayer boards 1.

According to FIG. 14, there are limits of ranges of the chamfer angle "θ" and the thickness-wise width "α" in which a desirable ability of a sample to endure repetitive bending processes is available. Specifically, ranges in which the chamfer angle "θ" is equal to or less than 35° and the thickness-wise width "α" is equal to or less than 0.3 mm are most preferable in ability of a sample to endure repetitive bending processes.

Figure 15:
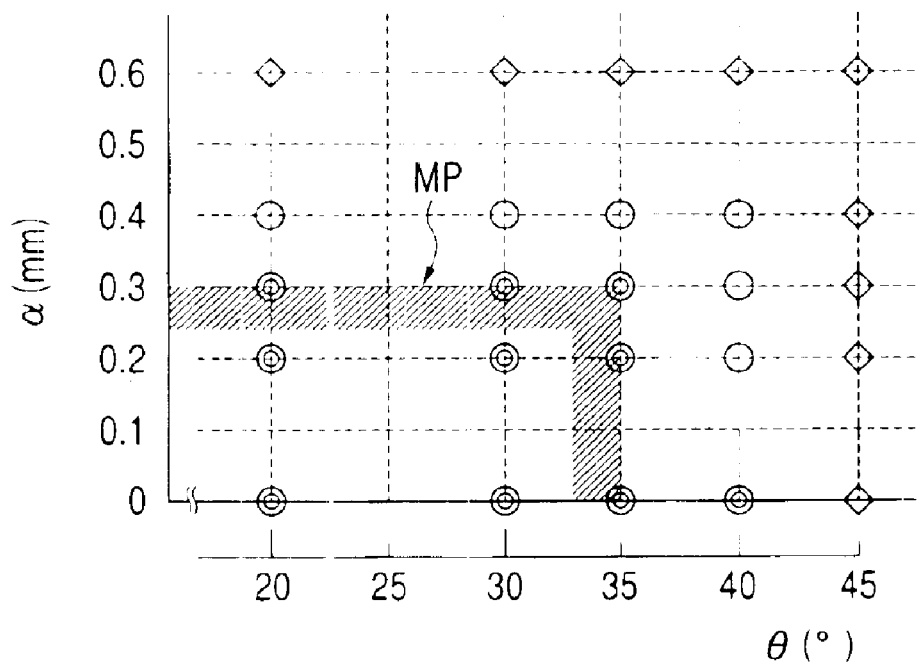
FIG. 15 is a diagram of the evaluation results in an arrangement modified from that in FIG. 14.

FIG. 15 shows rearrangement of the evaluation results in FIG. 14. In FIG. 15, the abscissa denotes the chamfer angle "θ" while the ordinate denotes the thickness-wise width "α". The rectangular zone MP denotes the most preferable ranges of the chamfer angle "θ" and the thickness-wise width "α" regarding the ability of a sample to endure repetitive bending processes.

Figure 16:
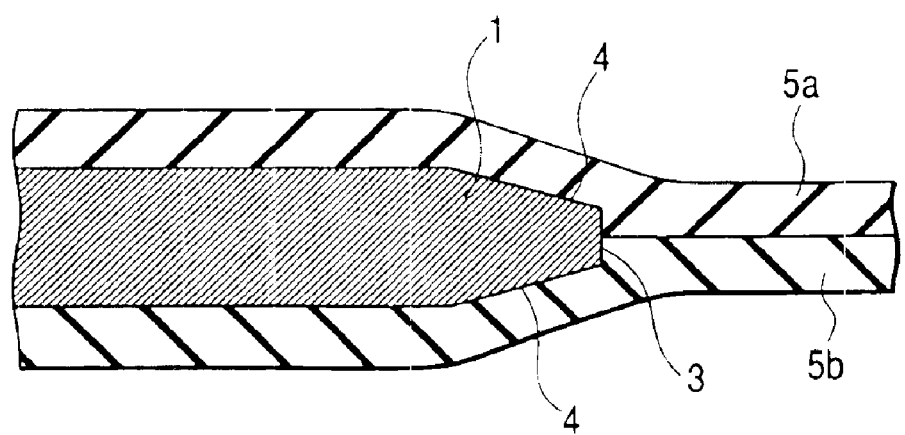
FIG. 16 is a sectional view of portions of the multilayer board and resin sheets in the flexible rigid printed wiring board in the first embodiment of this invention.

As shown in FIG. 16, a portion of a multilayer board (a rigid substrate) 1 which adjoins an opening 3 is beveled or chamfered to form inclined surfaces 4. Resin sheets 5a and 5b are provided on the chamfered multilayer board 1, and are bonded together in the opening 3. As shown in FIG. 16, a gap is prevented from occurring among the chamfered multilayer board 1 and the resin sheets 5a and 5b at the edge of the opening 3. Portions of the resin sheets 5a and 5b which extend on and around the inclined surfaces 4 of the chamfered multilayer board 1 are of a substantially uniform thickness. Therefore, the ability of the resin sheets 5a and 5b to endure repetitive bending processes can be uniformly provided regardless of position on the resin sheets 5a and 5b.

When the wiring patterns 7b are provided at a high density, it is preferable to set the domain L (see FIG. 12) small in consideration of the thickness of the multilayer boards 1 and the density of the wiring patterns 7b. The domain L corresponds to the dimension of each inclined surface 4 which is measured along a direction parallel with the major surface of the related multilayer board 1.

It is preferable that the material for the resin sheets 5a and 5b meets conditions ① and ② indicated below. Also, it is preferable that the material for the resin sheets 5a and 5b meets at least one of conditions ③, ④, ⑤, ⑥, and ⑦ indicated below. Preferable examples of the material for the resin sheets 5a and 5b are epoxy-based resin, polyolefin-based resin, and polyimide-based resin.

① The material enables the resin sheets 5a and 5b to act as insulating layers.
② The material is flexible and endures repetitive bending processes after being fully cured.
③ The material provides a sheet thickness of about 70 µm when being in a semihard state (a B-stage state). The material provides a sheet thickness of about 50 µm after the semihard sheets are superposed on the wiring patterns 1b and are then fully cured by heat treatment.
④ The material has a good adhesion to a copper plating.
⑤ The material is suited for use as insulating material forming a multilayer board and also material forming a flexible board. The material can easily be processed by a laser device or a machine. The material has a chemical resistance, a heat resistance, and a fire resistance.
⑥ The material has a good insulation performance, an anti-migration performance, a proper coefficient of thermal expansion, and a low water absorption performance.
⑦ The material has proper electrical characteristics as that for a board. Especially, the material has a proper relative dielectric constant and an acceptable dielectric loss tangent.

Second Embodiment

Figure 17:
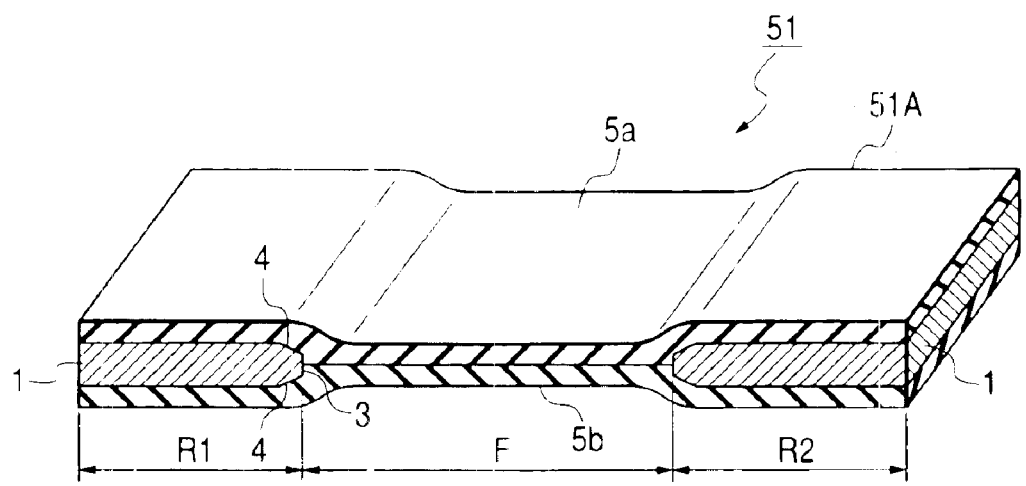
FIG. 17 is a perspective view, partially in section, of a flexible rigid printed wiring board according to a second embodiment of this invention.

FIG. 17 shows a flexible rigid printed wiring board 51 in a second embodiment of this invention which is similar to the first embodiment thereof except for design changes mentioned hereafter. The flexible rigid printed wiring board 51 is basically similar to the flexible rigid printed wiring board 50 (see FIG. 1).

During the fabrication of the flexible rigid printed wiring board 51, the second embodiment of this invention employs a resin sheet laminated to a carrier film (not shown) having a good heat resistance. The carrier film has an exfoliation performance with respect to the resin sheet after the execution of heat treatment. The resin sheet on the carrier film is made of suitable material in a semihard state (a B-stage state) which is flexible and bendable even after falling into a fully cured state (a C-stage state). Examples of the material for the resin sheet are epoxy resin, epoxy-based resin, polyolefin resin, polyolefin-based resin, polyimide resin, and polyimide-based resin. The resin sheet on the carrier film has a thickness of, for example, 70 µm.

Two pieces of the carrier film with the resin sheet are placed on opposite sides of an intermediate-product body in a manner such that the two resin sheets contact the surfaces of the intermediate-product body. Subsequently, the two resin sheets are bonded to the surfaces of the intermediate-product body by a thermo compression bonding procedure. Then, the carrier film pieces are separated from the resin sheets so that the resin sheets on the intermediate-product body are exposed. Copper layers are formed on the surfaces of the resin sheets by plating. The copper layers are patterned. In this way, the intermediate product is processed into an end product, that is, a flexible rigid printed wiring board 51.

The method of fabricating the flexible rigid printed wiring board 51 includes steps S1 to S9 which are similar to those in the first embodiment of this invention. The method of fabricating the flexible rigid printed wiring board 51 further includes steps S10A and S11A.

Figure 19:
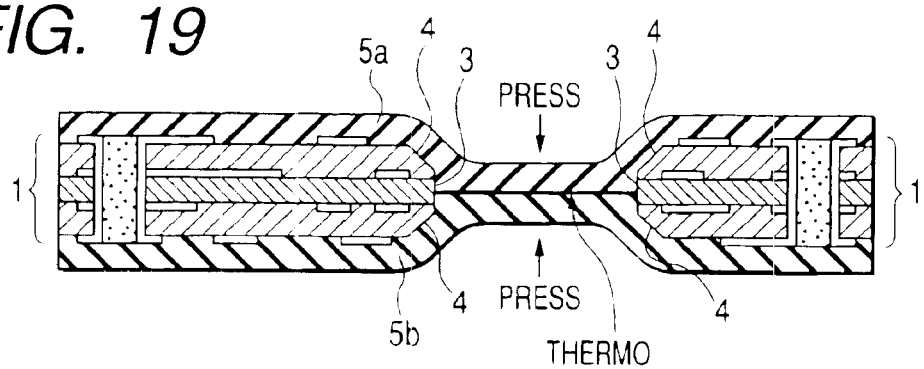
FIGS. 19–23 are sectional views of intermediate-product bodies which occur at different stages during the fabrication of the flexible rigid printed wiring board in the second embodiment of this invention.

The step S10A follows the step S9. In the step S10A, resin sheets 5a and 5b are pressed inward by a vacuum laminator (not shown) while being heated. Thus, as shown in FIG. 19, the resin sheets 5a and 5b are forced into an opening 3, being brought into contact with each other in the opening 3 and being pressed against each other therein. Accordingly, the resin sheets 5a and 5b are bonded together in the opening 3 by a thermo compression bonding procedure. It should be noted that the resin sheets 5a and 5b are supported by carrier films respectively.

In the step S10A, it is preferable to implement the press of the resin sheets 5a and 5b by use of a diaphragm of hard rubber with an internal pressure raised by compressed air. In this case, the resin sheets 5a and 5b in the opening 3 can be sufficiently pressed. Preferably, the heating in the step S10A is at a temperature of 120° C. regardless of whether the material for the resin sheets 5a and 5b is epoxy-based resin, polyolefin-based resin, or polyimide-based resin. Preferably, the press in the step S10A is at a pressure of 7 kg/cm² regardless of whether the material for the resin sheets 5a and 5b is epoxy-based resin, polyolefin-based resin, or polyimide-based resin.

In the step S11A which follows the step S10A, the resin sheets 5a and 5b on a multilayer board 1 are fully cured by heat treatment. Preferable conditions of the heat treatment are as follows. In the case where the material for the resin sheets 5a and 5b is epoxy-based resin, the heat treatment is executed for 60 minutes at a temperature of 180° C. In the case where the material for the resin sheets 5a and 5b is polyolefin-based resin, the heat treatment is executed for 60 minutes at a temperature of 170° C. In the case where the material for the resin sheets 5a and 5b is polyimide-based resin, the heat treatment is executed for 60 minutes at a temperature of 200° C. As a result of the full cure, the resin sheets 5a and 5b adhere to the multilayer board 1 and become buildup insulating layers forming a single body together with the multilayer board 1. It is preferable that during the execution of the heat treatment in the step S11A, the multilayer board 1 is held erected by a suitable support device such as a support jig. In this case, the resin sheets 5a and 5b in the opening 3 of the multilayer board 1 are prevented from sagging under their own weights.

As a result of the steps S1–S9, S10A, and S11A, an intermediate-product body is made. The intermediate-product body includes the multilayer board 1 and the resin sheets 5a and 5b (see FIG. 19). The resin sheets 5a and 5b are superposed on the two major surfaces of the multilayer board 1 as buildup insulating layers. The intermediate-product body has a flexible portion F and rigid portions R1 and R2 (see FIG. 21). The flexible portion F of the intermediate-product body is formed by portions of the resin sheets 5a and 5b which extend in the opening 3 of the multilayer board 1. The rigid portions R1 and R2 of the intermediate-product body include the multilayer board 1 and portions of the resin sheets 5a and 5b which extend outside the opening 3 in the multilayer board 1.

The method of fabricating the flexible rigid printed wiring board 51 further includes steps S12A to S16A.

Figure 20:
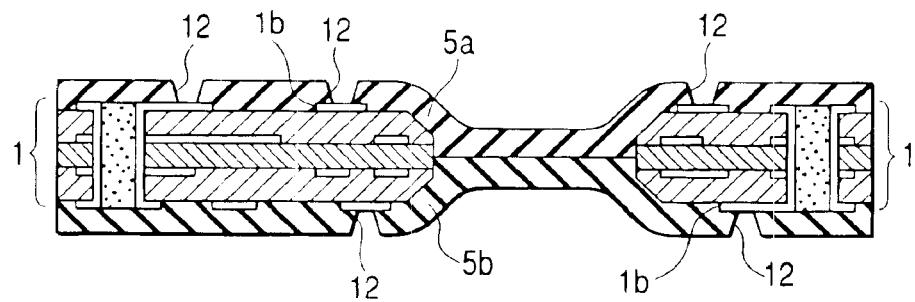

The step S12A follows the step S11A. In the step S12A, the carrier film pieces are removed from the intermediate-product body. During the step S12A, as shown in FIG. 20, via holes (laser blind via holes) 12 are provided in the resin sheets 5a and 5b at prescribed places by a known procedure. The via holes 12 reach wiring patterns 1b on the multilayer board 1.

Figure 21:
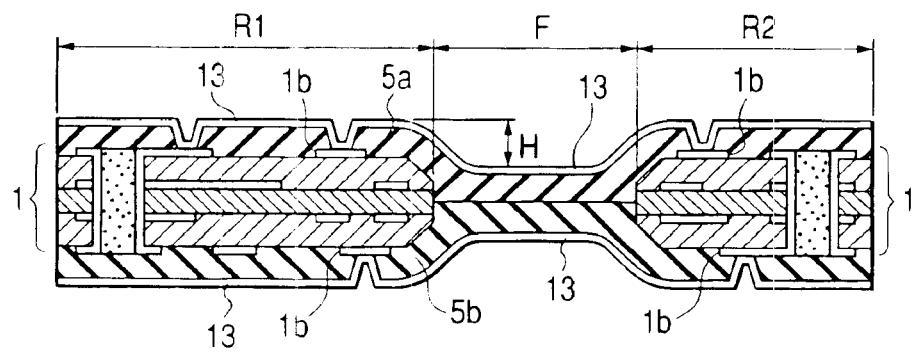

In the step S13A which follows the step S12A, the intermediate-product body is subjected to chemical copper plating and copper electroplating. Therefore, as shown in FIG. 21, the exposed surfaces of the intermediate-product body are coated with copper layers 13. Thus, the surfaces of the intermediate-product body which define the via holes 12 are covered with the copper layers 13. The copper layers 13 extending in the via holes 12 provide electrical connection between the wiring patterns 1b on the multilayer board 1 and the copper layers 13 on the resin sheets 5a and 5b. The copper layers 13 have a thickness of, for example, about 20 $\mu$m.

The step S14A follows the step S13A. In the step S14A, the copper layers 13 are subjected to patterning. As shown in FIG. 21, there is an about 0.15-mm difference H in level between the upper surface of the flexible portion F and the upper surface of each of the rigid portions R1 and R2. There is a similar level difference H between the lower surface of the flexible portion F and the lower surface of each of the rigid portions R1 and R2. These level differences H are caused by pressing the resin sheets 5a and 5b into the opening 3 in the multilayer board 1. It is preferable that the patterning employs liquid photoresist of an electrodeposition type which can follow roughness caused by the level differences H. For example, "Zonne EDUV376" produced by Kansai Paint Co., Ltd. can be used as such photoresist.

During the patterning in the step S14A, photoresist is provided on the surfaces of the copper layers 13 by electrodeposition. Thereafter, the intermediate-product body with the photoresist is subjected to exposure via pattern films for prescribed conductor patterns. The pattern films contact the rigid portions R1 and R2. Preferably, the exposure is implemented by a projection aligner having a great depth of field. In this case, even when the pattern films are separate from the flexible portion F due to the presence of the steps H, good exposure focus is available to the flexible portion F. Thus, in this case, fine patterns can be formed on not only the rigid portions R1 and R2 but also the flexible portion F.

Figure 22:
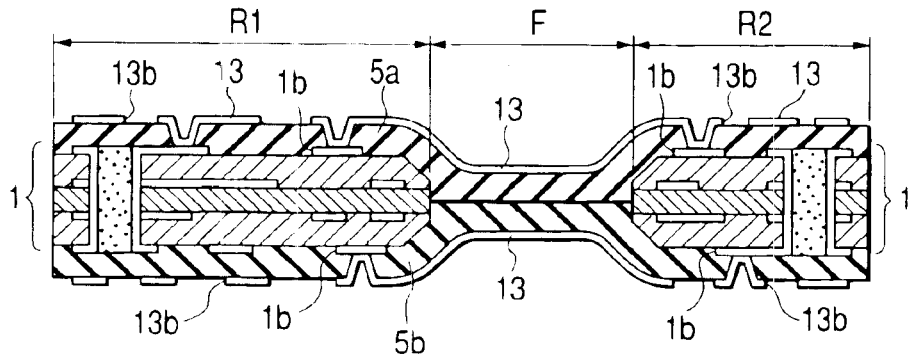

In the step S14A, after the exposure by the aligner, the intermediate-product body is subjected to development and etching so that wiring patterns 13b are formed on the flexible portion F and the rigid portions R1 and R2 as shown in FIG. 22. The wiring patterns 13b on the flexible portion F have a line width of, for example, 75 $\mu$m and a space width of, for example, 75 $\mu$m. The wiring patterns 13b on the rigid portions R1 and R2 have a line width of, for example, 50 $\mu$m and a space width of, for example, 50 $\mu$m.

It should be noted that the exposure in the step S14A may be implemented by a laser direct image system using a laser beam.

Figure 23:
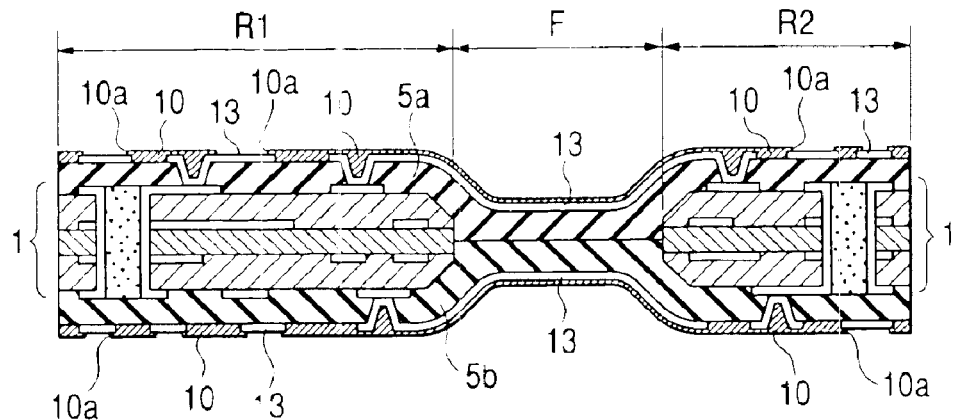

The step S15A follows the step S14A. In the step S15A, as shown in FIG. 23, solder resist layers 10 are formed on the exposed surfaces of the intermediate-product body by a laminator (a laminating machine). During the step S15A, the solder resist layers 10 are processed into prescribed patterns by etching which uses photoresists. The prescribed patterns have openings 10a. The solder resist layers 10 act as cover lays or protective layers in the flexible portion F.

The material for the solder resist layers 10 can use cover lay material for an ordinary flexible board which is bendable and photosensitive. Preferably, the laminator used in the step S15A is of a vacuum type. Preferably, the solder resist layers 10 are patterned by a projection aligner. As previously mentioned, the resultant resist layers 10 have openings 10a.

Figure 18:
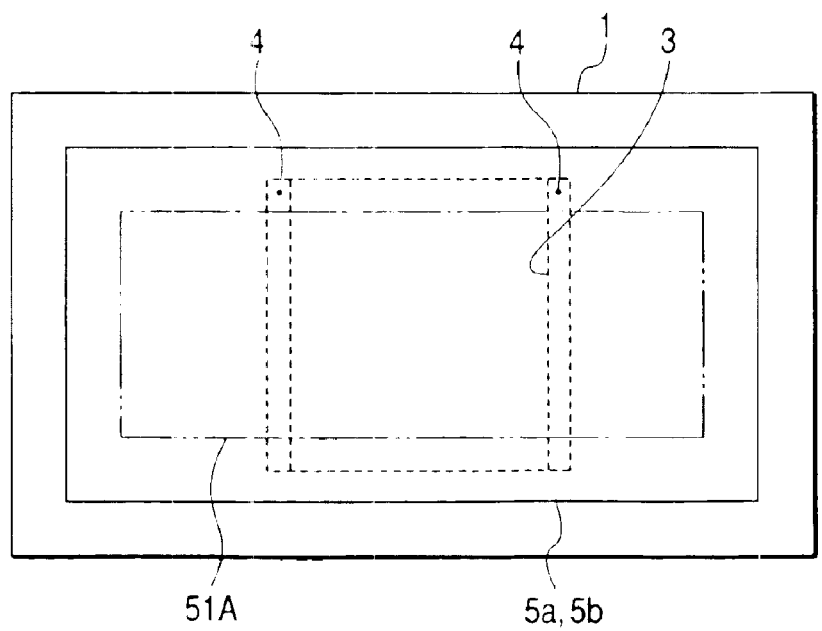
FIG. 18 is a plan view of an intermediate-product body which occurs during the fabrication of the flexible rigid printed wiring board in the second embodiment of this invention.

In the step S16A which is subsequent to the step S15A, the intermediate-product body is cut into a prescribed shape 51A by suitable processing so that a flexible rigid printed wiring board 51 is completed (see FIGS. 17 and 18).

As understood from the previous description, the flexible portion F and the rigid portions R1 and R2 of the flexible rigid printed wiring board 51 can be made by a sequence of steps using a common manufacturing installation. This is advantageous to a reduction in production cost.

The wiring patterns 1b on the multilayer boards 1 in the rigid portions R1 and R2 are electrically connected via wiring patterns including the wiring patterns on the flexible portion F. In each of the rigid portions R1 and R2, the wiring patterns can easily be aligned.

The method of fabricating the flexible rigid printed wiring board 51 will be further described hereafter. In the step S10A, the resin sheets 5a and 5b supported by the carrier films are subjected to the thermo compression bonding procedure by the vacuum laminator (see FIG. 19). During the thermo compression bonding procedure, the carrier films prevent the material for the resin sheets 5a and 5b from considerably dropping in viscosity and undesirably flowing due to a temperature rise. Therefore, the resultant resin sheets 5a and 5b have a sufficient thickness.

It should be noted that the thermo compression bonding procedure may be replaced by another way of bonding the resin sheets 5a and 5b together.

It is preferable that the material for the resin sheets 5a and 5b meets the previously-indicated conditions ① and ②. Also, it is preferable that the material for the resin sheets 5a and 5b meets at least one of the previously-indicated conditions ③, ④, ⑤, ⑥, and ⑦. Furthermore, it is preferable that the material for the resin sheets 5a and 5b meets a condition as follows. The material provides a sheet surface which can be made rugged by use of potassium permanganate. The rugged surface has a good adhesion to a copper plating.

Third Embodiment

A third embodiment of this invention is similar to the first or second embodiment thereof except for design changes mentioned hereafter. According to the third embodiment of this invention, a flexible rigid printed wiring board 54 (see FIG. 27) is designed to reduce steps H. The reduced steps H enable finer wiring patterns to be provided on a flexible portion F.

In the third embodiment of this invention, an opening 3 in a multilayer board (a rigid substrate) 1 is filled with flexible resin films such as photosensitive resin films. Thereafter, resin sheets 5a and 5b are formed on the multilayer board 1 and the resin films. The resin films in the opening 3 cause smaller steps H.

The method of fabricating the flexible rigid printed wiring board 54 includes steps S1 to S8 which are similar to those in the first or second embodiment of this invention. The method of fabricating the flexible rigid printed wiring board 54 further includes steps S10B to S14B.

Figure 24:
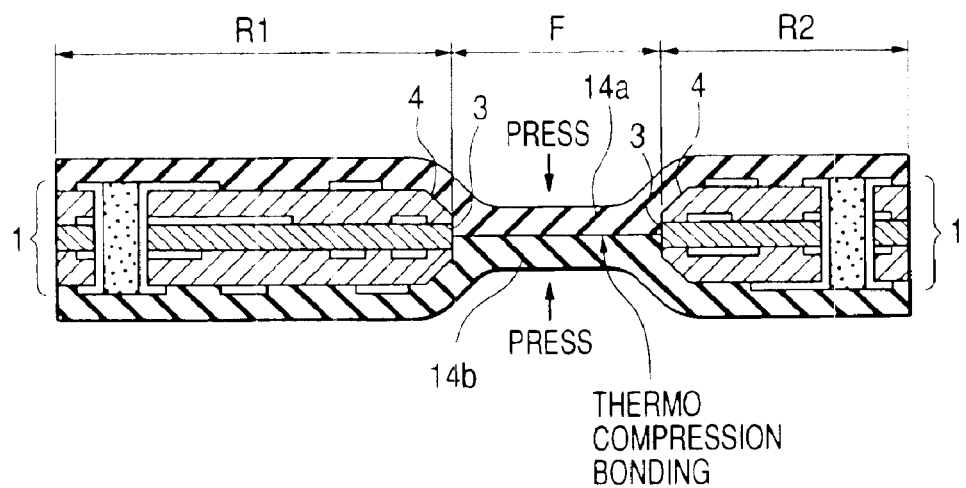
FIGS. 24–26 are sectional views of intermediate-product bodies which occur at different stages during the fabrication of a flexible rigid printed wiring board in a third embodiment of this invention.

The step S10B follows the step S8. In the step S10B, as shown in FIG. 24, two photosensitive resin films 14a and 14b are provided respectively on opposite main surfaces of a multilayer board 1 by a vacuum laminator (not shown). The photosensitive resin films 14a and 14b are pressed inward by the vacuum laminator while being heated. Thus, as shown in FIG. 24, the photosensitive resin films 14a and 14b are forced into an opening 3 of the multilayer board 1, being brought into contact with each other in the opening 3 and being pressed against each other therein. Accordingly, the photosensitive resin films 14a and 14b are bonded together in the opening 3 by a thermo compression bonding procedure. The photosensitive resin films 14a and 14b can use ordinary photoresist films such as "Raytec FR-5000 (trademark)" produced by Hitachi Chemical Co., Ltd.

In the step S10B, it is preferable to implement the press of the photosensitive resin films 14a and 14b by use of a diaphragm of hard rubber with an internal pressure raised by compressed air. In this case, the photosensitive resin films 14a and 14b in the opening 3 can be sufficiently pressed. Preferably, the heating in the step S10B is at a temperature of 80° C. Preferably, the press in the step S10B is at a pressure of 5 kg/cm$^2$.

Figure 25:
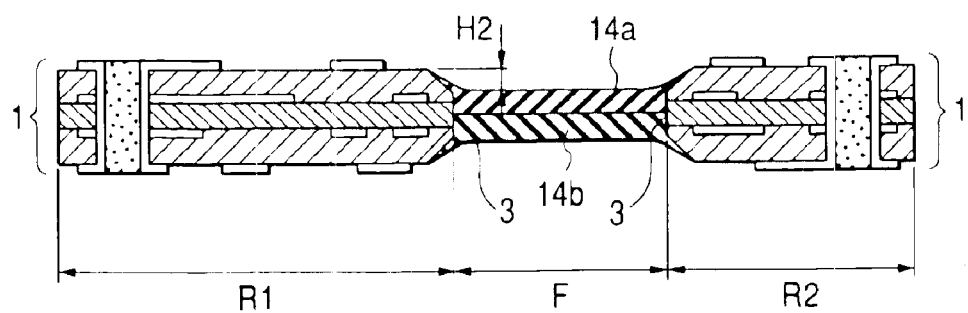

In the step S11B which follows the step S10B, as shown in FIG. 25, unnecessary portions of the photosensitive resin films 14a and 14b which extend outside the opening 3 are removed by photolithography. Therefore, the photosensitive resin films 14a and 14b remain only in the opening 3. After the removal of the unnecessary portions, the surfaces of central areas of the photosensitive resin films 14a and 14b in the opening 3 are located in slightly depressed positions relative to the major surfaces of the multilayer board 1. As shown in FIG. 25, there is an about 0.10-mm difference H2 in level between the upper surface of a flexible portion F and the upper surface of each of rigid portions R1 and R2. There is a similar level difference H2 between the lower surface of the flexible portion F and the lower surface of each of the rigid portions R1 and R2.

In the step S12B which is subsequent to the step S11B, the photosensitive resin films 14a and 14b are irradiated with ultraviolet rays before being heated and cured. Preferably, the ultraviolet-ray irradiation is at 1 J/cm$^2$. Preferably, the heating is executed at a temperature of 160° C. by continuously placing the photosensitive resin films 14a and 14b in an air heating furnace for 60 minutes.

Figure 26:
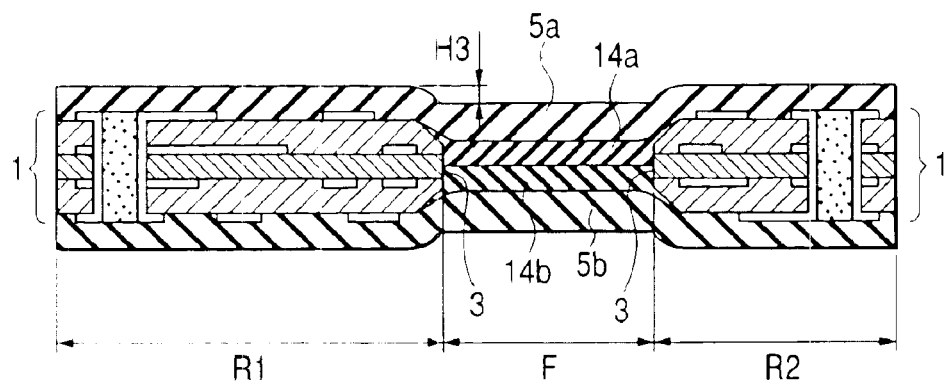

The step S13B follows the step S12B. In the step S13B, as shown in FIG. 26, two resin sheets 5a and 5b are provided on opposite main surfaces of the multilayer board 1 and the photosensitive resin films 14a and 14b by the vacuum laminator. In the step S13B, the resin sheets 5a and 5b are pressed inward by the vacuum laminator while being heated. Thus, as shown in FIG. 26, the resin sheets 5a and 5b are forced partially into an opening 3, being bonded to the multilayer board 1 and the photosensitive resin sheets 14a and 14b by a thermo compression bonding procedure. The resin sheets 5a and 5b cover the photosensitive resin films 14a and 14b in the opening 3. The resin sheets 5a and 5b are made of epoxy-based resin, polyolefin-based resin, or polyimide-based resin.

In the step S13B, it is preferable to implement the press of the resin sheets 5a and 5b by use of a diaphragm of hard rubber with an internal pressure raised by compressed air. In this case, the resin sheets 5a and 5b extending in areas corresponding to the opening 3 can be sufficiently pressed. Preferably, the heating in the step S13B is at a temperature of 120° C. regardless of whether the material for the resin sheets 5a and 5b is epoxy-based resin, polyolefin-based resin, or polyimide-based resin. Preferably, the press in the step S13B is at a pressure of 7 kg/cm$^2$ regardless of whether the material for the resin sheets 5a and 5b is epoxy-based resin, polyolefin-based resin, or polyimide-based resin.

In the step S14B which follows the step S13B, the resin sheets 5a and 5b on the multilayer board 1 are fully cured by heat treatment. Preferable conditions of the heat treatment are as follows. In the case where the material for the resin sheets 5a and 5b is epoxy-based resin, the heat treatment is executed for 60 minutes at a temperature of 180° C. In the case where the material for the resin sheets 5a and 5b is polyolefin-based resin, the heat treatment is executed for 60 minutes at a temperature of 170° C. In the case where the material for the resin sheets 5a and 5b is polyimide-based resin, the heat treatment is executed for 60 minutes at a temperature of 200° C. As a result of the full cure, the resin sheets 5a and 5b adhere to the multilayer board 1 and the photosensitive resin films 14a and 14b, and become buildup insulating layers forming a single body together with the multilayer board 1 and the photosensitive resin films 14a and 14b.

As a result of the steps S1–S8, and S10B–S14B, an intermediate-product body is made. The intermediate-product body includes the multilayer board 1, the resin sheets 5a and 5b, and the photosensitive resin films 14a and 14b (see FIG. 26). The resin sheets 5a and 5b are superposed on the two major surfaces of the multilayer board 1 and the photosensitive resin films 14a and 14b as buildup insulating layers. The intermediate-product body has a flexible portion F and rigid portions R1 and R2 (see FIG. 26). The flexible portion F of the intermediate-product body is formed by the photosensitive resin films 14a and 14b in the opening 3 of the multilayer board 1 and also portions of the resin sheets 5a and 5b which extend in areas corresponding to the opening 3. The resin films 5a and 5b partially enter the opening 3. The rigid portions R1 and R2 of the intermediate-product body include the multilayer board 1 and portions of the resin sheets 5a and 5b which extend outside the opening 3 in the multilayer board 1.

The method of fabricating the flexible rigid printed wiring board 54 further includes steps S12A to S16A similar to those in the second embodiment of this invention.

In the step S14A, copper layers 13 are subjected to patterning which uses ordinary dry films as photoresists for exposure.

As shown in FIG. 26, there is an about 0.10-mm difference H3 in level between the upper surface of the flexible portion F and the upper surface of each of the rigid portions R1 and R2. There is a similar level difference H3 between the lower surface of the flexible portion F and the lower surface of each of the rigid portions R1 and R2.

Since the level differences H3 are relatively small, the dry films can easily be brought into close contact with the surfaces of the resin sheets 5a and 5b in the step S14A.

It should be noted that the step S14A may use photoresists of the electrodeposition type.

The exposure in the step S14A is implemented by an ordinary aligner which differs from a projection aligner having a great depth of field.

Figure 27:
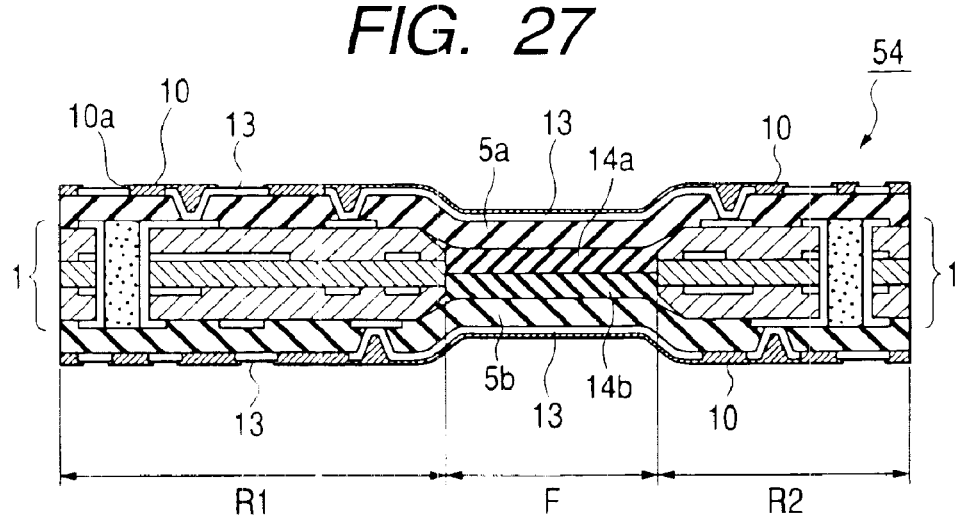
FIG. 27 is a sectional view of the flexible rigid printed wiring board in the third embodiment of this invention.

When the step S16A has been carried out, a flexible rigid printed wiring board 54 is completed (see FIG. 27).

Fourth Embodiment

Figure 28:
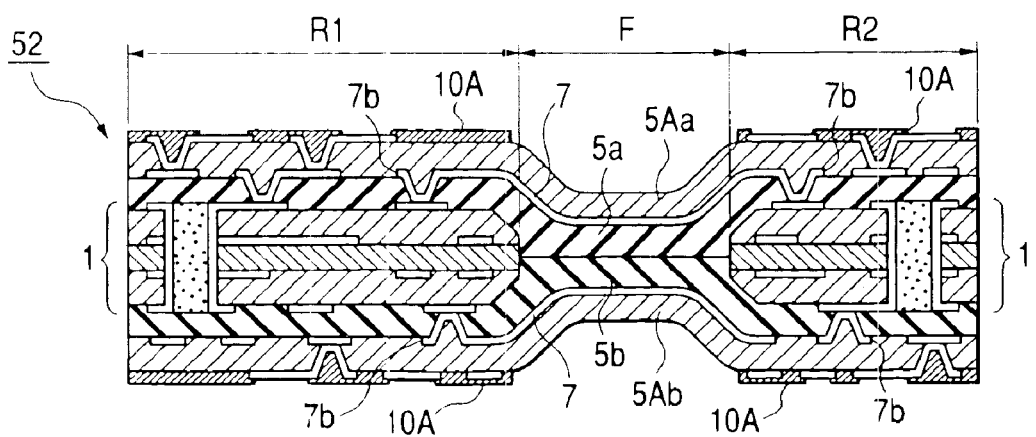
FIG. 28 is a sectional view of a flexible rigid printed wiring board according to a fourth embodiment of this invention.

FIG. 28 shows a flexible rigid printed wiring board 52 in a fourth embodiment of this invention. The flexible rigid printed wiring board 52 is similar to that in the first, second, or third embodiment of this invention except for design changes mentioned hereafter.

As shown in FIG. 28, the flexible rigid printed wiring board 52 includes resin sheets 5A*a* and 5A*b* made of the same material as that for resin sheets 5*a* and 5*b*. The resin sheet 5A*a* is superposed on the wiring pattern 7*b* on the resin sheet 5*a* and the exposed surfaces of the resin sheet 5*a*. The resin sheet 5A*a* acts as a cover lay for protecting the wiring pattern 7*b* on the resin sheet 5*a*. The resin sheets 5*a* and 5A*a* are two buildup layers on an upper side of the flexible rigid printed wiring board 52. On the other hand, the resin sheet 5A*b* is superposed on the wiring pattern 7*b* on the resin sheet 5*b* and the exposed surfaces of the resin sheet 5*b*. The resin sheet 5A*b* acts as a cover lay for protecting the wiring pattern 7*b* on the resin sheet 5*b*. The resin sheets 5*b* and 5A*b* are two buildup layers on a lower side of the flexible rigid printed wiring board 52.

As shown in FIG. 28, a solder resist layer 10A is formed on an upper surface of the resin sheet 5A*a*. Also, a solder resist layer 10A is formed on a lower surface of the resin sheet 5A*b*. The solder resist layers 10A may extend in only rigid portions R1 and R2. The solder resist layers 10A can be made of non-flexible material.

A flexible portion F and the rigid portions R1 and R2 of the flexible rigid printed wiring board 52 can be made by a sequence of steps using a common manufacturing installation. This is advantageous to a reduction in production cost.

The upper side of the flexible rigid printed wiring board 52 has a coating which includes the resin sheets 5*a* and 5A*a*. Wiring patterns on the resin sheets 5*a* and 5A*a* can easily be aligned. The lower side of the flexible rigid printed wiring board 52 has a coating which includes the resin sheets 5*b* and 5A*b*. Wiring patterns on the resin sheets 5*b* and 5A*b* can easily be aligned.

Fifth Embodiment

A fifth embodiment of this invention is similar to one of the first to fourth embodiments thereof except for design changes mentioned hereafter. In the fifth embodiment of this invention, copper layers to be processed into wiring patterns are formed by copper foil layers or copper platings. Wiring patterns on opposite major surfaces of a board may be provided by different ways respectively.

Sixth Embodiment

A sixth embodiment of this invention is similar to one of the first to fifth embodiments thereof except for design changes mentioned hereafter. According to the sixth embodiment of this invention, multilayer boards (solid substrates) 1 are juxtaposed on a side-by-side basis. There is a spacing 3 between the multilayer boards 1 which corresponds to a flexible portion F of an end product. Then, resin sheets 5*a* and 5*b* are provided on the multilayer boards 1. The resin sheets 5*a* and 5*b* connects the multilayer boards 1. The resin sheets 5*a* and 5*b* and the multilayer boards 1 compose a single body forming an end product, that is, a flexible rigid printed wiring board.

Seventh Embodiment

A seventh embodiment of this invention is similar to one of the first to sixth embodiments thereof except for design changes mentioned hereafter. According to the seventh embodiment of this invention, a flexible rigid printed wiring board includes rigid portions R1 and R2 having different numbers of layers respectively. The rigid portions R1 and R2 are connected by a flexible portion F.

Eighth Embodiment

An eighth embodiment of this invention is similar to one of the first to seventh embodiments thereof except for design changes mentioned hereafter. According to the eighth embodiment of this invention, a flexible rigid printed wiring board has only one rigid portion (R1 or R2) and a flexible portion F connected with the rigid portion. Specifically, one end of the flexible portion F is connected with the rigid portion while the other end thereof is free.

A plug electrically connected with wiring patterns on a multilayer board 1 in the rigid portion may be mounted on the free end of the flexible portion F. When the plug is moved into engagement with a connector, electrical connection from outside to the wiring patterns on the multilayer board 1 in the rigid portion is provided.

Ninth Embodiment

Figure 29:
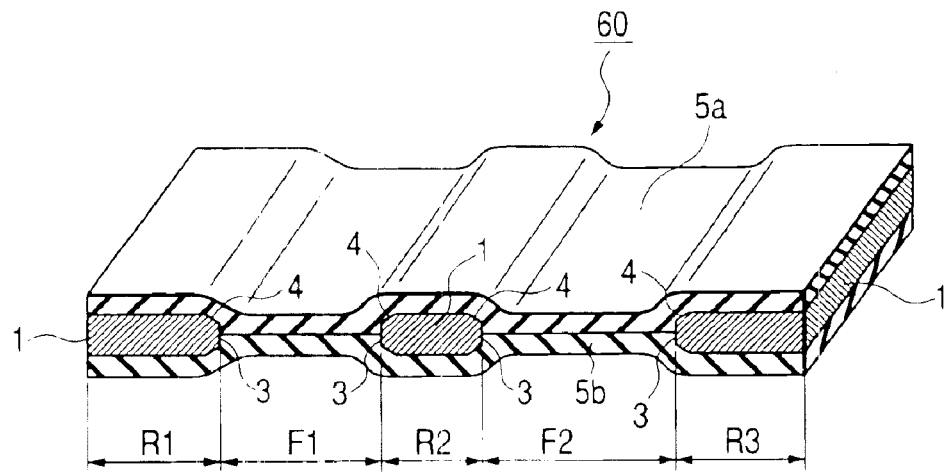
FIG. 29 is a perspective view, partially in section, of a flexible rigid printed wiring board according to a ninth embodiment of this invention.

FIG. 29 shows a flexible rigid printed wiring board 60 according to a ninth embodiment of this invention. The flexible rigid printed wiring board 60 is similar to that in one of the first to seventh embodiments of this invention except for design changes mentioned hereafter. As shown in FIG. 29, the flexible rigid printed wiring board 60 includes rigid portions R1, R2, and R3, and flexible portions F1 and F2. The flexible portion F1 is located between the rigid portions R1 and R2. The flexible portion F2 is located between the rigid portions R2 and R3. An original multilayer board 1 has separate openings 3 which correspond to the flexible portions F1 and F2 respectively.

Tenth Embodiment

A tenth embodiment of this invention is similar to one of the first to third embodiments thereof except for design changes mentioned hereafter. According to the tenth embodiment of this invention, only one side (only one major surface) of an intermediate-product body is provided with one or more resin sheets (5*a* or 5*b*). First portions of the resin sheets form a flexible portion F of an end product, that is, a flexible rigid printed wiring board. Second portions of the resin sheets form a first rigid portion R1 of the end product together with a solid substrate. Third portions of the resin sheets form a second rigid portion R2 of the end product together with a solid substrate. The number of the resin sheets in the first rigid portion R1 is equal to or different from the number of resin sheets in the second rigid portion R2.

Eleventh Embodiment

Figure 30:
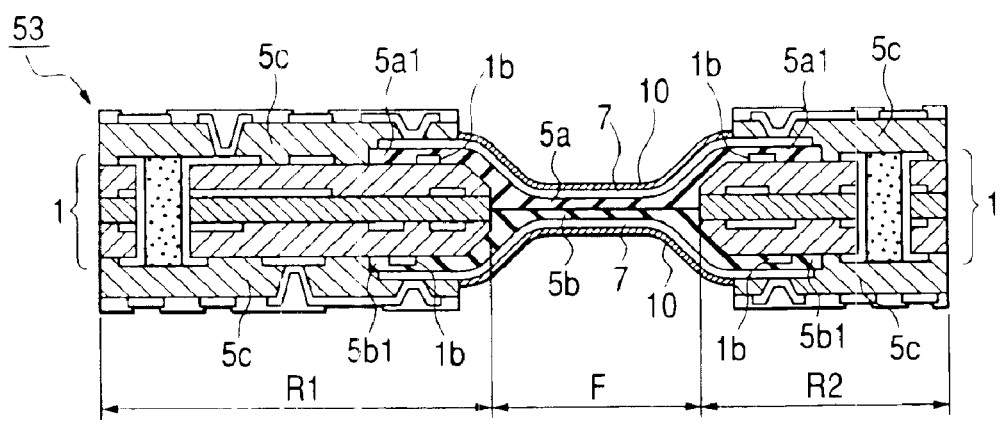
FIG. 30 is a sectional view of a flexible rigid printed wiring board according to an eleventh embodiment of this invention.

FIG. 30 shows a flexible rigid printed wiring board 53 according to an eleventh embodiment of this invention. The flexible rigid printed wiring board 53 is similar to that in the first embodiment of this invention except for design changes mentioned hereafter. As shown in FIG. 30, insulating layers 5c made of buildup insulating material are provided on opposite major surfaces of multilayer boards 1 which have wiring patterns 1b. The insulating layers 5c may be provided on surfaces of the multilayer boards 1 which are not opposite to each other. Resin sheets 5a and 5b cover and insulate only portions of the wiring patterns 1b near a flexible portion F. Portions 5a1 and 5b1 of the resin sheets 5a and 5b which extend on the multilayer boards 1 are used for interlayer connection with respect to the insulating layers 5c.

Twelfth Embodiment

Figure 31:
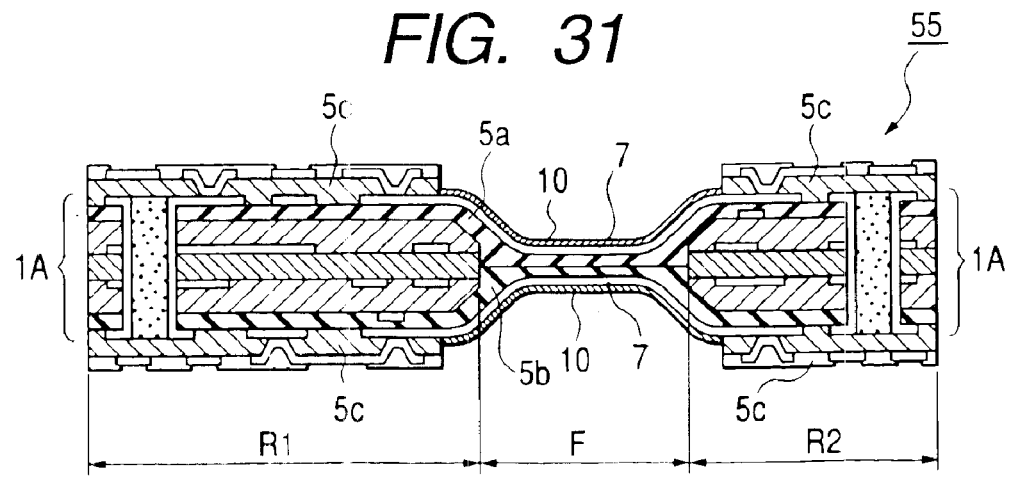
FIG. 31 is a sectional view of a flexible rigid printed wiring board according to a twelfth embodiment of this invention.

FIG. 31 shows a flexible rigid printed wiring board 55 according to a twelfth embodiment of this invention. The flexible rigid printed wiring board 55 is similar to that in the first embodiment of this invention except for design changes mentioned hereafter. As shown in FIG. 31, the flexible rigid printed wiring board 55 includes multilayer boards 1A instead of the multilayer boards 1 (see FIG. 1). Outer surfaces of each of the multilayer boards 1A are void of wiring patterns. Outermost layers (uppermost and lowermost layers) in the multilayer boards 1A are formed by portions of resin sheets 5a and 5b. Other portions of the resin sheets 5a and 5b constitute a flexible portion F. Insulating layers 5c are provided on the resin sheets 5a and 5b which extend in rigid portions R1 and R2. Since the resin sheets 5a and 5b are not designed as insulating layers, the thickness of the resin sheets 5a and 5b can be small. The small thickness of the resin sheets 5a and 5b is advantageous to the bending performance of the flexible portion F.

Thirteenth Embodiment

A thirteenth embodiment of this invention is similar to one of the first to twelfth embodiments thereof except for design changes mentioned hereafter. According to the thirteenth embodiment of this invention, material for a resin sheet 5a and material for a resin sheet 5b differ from each other. For example, one of the resin sheets 5a and 5b is made of epoxy-based material while the other is made of polyolefin-based material.

Fourteenth Embodiment

A fourteenth embodiment of this invention is similar to one of the first to thirteenth embodiments thereof except for design changes mentioned hereafter. According to the fourteenth embodiment of this invention, each of resin sheets 5a and 5b includes a laminate of layers made of different resin materials respectively.

Advantages Provided by the Invention

In this invention, first and second resin sheets are respectively superposed on surfaces of a multilayer board (a rigid substrate) having an opening and wiring patterns. Portions of the multilayer board, and the first and second resin sheets which extend outside the opening will form rigid portions of an end product, that is, a flexible rigid printed wiring board. Other portions of the first and second resin sheets extend in the opening, and are bonded together to form a flexible portion of the end product. The flexible portion and the rigid portions of the flexible rigid printed wiring board can be made by a sequence of steps using a common manufacturing installation. This is advantageous to a reduction in production cost.

Edges of the multilayer board which connect with the flexible portion are chamfered. The chamfered edges of the multilayer board make it possible that the ability of the first and second resin sheets to endure repetitive bending processes is uniformly provided regardless of position on the first and second resin sheets.

Each of the first and second resin sheets may include a laminate of resin layers. Also in this case, the flexible portion and the rigid portions of the flexible rigid printed wiring board can be made by a sequence of steps using a common manufacturing installation. This is advantageous to a reduction in production cost.

In this invention, a flexible rigid printed wiring board has rigid portions containing multilayer boards (rigid substrates) respectively. Wiring patterns are provided on the multilayer boards, respectively. A first resin sheet or a second resin sheet is formed with a wiring pattern. The wiring patterns on the multilayer boards are electrically connected with each other by the wiring pattern on the first or second resin film. Thus, also in the case where the flexible rigid printed wiring board has a laminate of layers formed with respective wiring patterns, it is easy to provide a good alignment between the wiring patterns on the different layers.

A first example of the first or second resin sheet is made of epoxy-based resin. In this case, the composition of the basic material for the rigid portions of the flexible rigid printed wiring board can be the same as that for the flexible portion thereof, and the rigid portions and the flexible portion can be substantially equal in coefficient of thermal expansion. Thus, in this case, it is possible to provide the following advantages. Conditions of the connection of plating to the walls defining through holes are held uniform independent of a temperature change. Exfoliation is prevented from occurring in connecting portions due to a temperature change. An improved alignment between wiring patterns in different layers is obtained. Warp of the flexible rigid printed wiring board is prevented from occurring. Electronic components can be accurately and surely mounted on the flexible rigid printed wiring board. Epoxy-based resin has a low water absorption performance. Thus, epoxy-based resin is free from a decrease in soldering-related heat resistance due to water absorption. Accordingly, it is possible to dispense with a preliminarily drying process.

A second example of the first or second resin sheet is made of polyolefin-based resin. In this case, the first or second resin sheet has a low tanδ characteristic (a low dielectric loss tangent). Thus, even when a radio-frequency circuit pattern is provided on the flexible rigid printed wiring board, an electric loss can be suppressed.

A third example of the first or second resin sheet is made of polyimide-based resin. In this case, the first or second resin sheet has excellent bending and curving performances. Thus, the flexible rigid printed wiring board can be used for a long term even though the board is repetitively bent.

According to this invention, a method of fabricating a flexible rigid printed wiring board includes a first step, a second step, and a third step. The first step is to provide an opening in a rigid substrate. The opening corresponds to a flexible portion of the flexible rigid printed wiring board. The second step is to coat first and second surfaces of the rigid substrate with first and second resin sheets respectively. The first and second resin sheets extend in and over the opening in the rigid substrate. The third step is to bond the first and second resin sheets together in the opening. Portions of the rigid substrate, and the first and second resin sheets which extend outside the opening correspond to rigid portions of the flexible rigid printed wiring board. Accordingly, the flexible portion and the rigid portions of the flexible rigid printed wiring board can be made by a sequence of steps using a common manufacturing installation. This is advantageous to a reduction in production cost.

What is claimed is:

1. A flexible rigid printed wiring board comprising:
   a plurality of rigid wiring boards having wiring patterns and being spatially separate from each other; and
   a flexible portion connecting the rigid wiring boards and including an insulating and flexible resin sheet;
   wherein the insulating and flexible resin sheet includes first portions of first and second sub resin sheets, and the first portions of the first and second sub resin sheets are in direct contact with each other and are bonded together, and wherein the first and second sub resin sheets have second portions covering and adhering to surfaces of the rigid wiring boards.

2. A flexible rigid printed wiring board as recited in claim 1, wherein an edge of each of the rigid wiring boards, which adjoins the flexible portion, has a chamfer.

3. A flexible rigid printed wiring board as recited in claim 2, wherein the chamfer has a prescribed angle "q" relative to a major surface of the related rigid wiring board, and the edge of each of the rigid wiring boards has a non-chamfered end surface portion with a prescribed thickness-wise width "a", and wherein the angle "q" is equal to or less than 35°, and the width "a" is equal to or less than 0.3 mm.

4. A flexible rigid printed wiring board as recited in claim 1, wherein at least one of the first and second sub resin sheets includes a laminate of resin layers.

5. A flexible rigid printed wiring board as recited in claim 1, further comprising a wiring pattern provided on at least one of the first and second sub resin sheets and electrically connecting the wiring patterns on the rigid wiring boards.

6. A flexible rigid printed wiring board as recited in claim 1, wherein at least one of the first and second sub resin sheets is made of epoxy-based resin.

7. A flexible rigid printed wiring board as recited in claim 1, wherein at least one of the first and second sub resin sheets is made of polyolefin-based resin.

8. A flexible rigid printed wiring board as recited in claim 1, wherein at least one of the first and second sub resin sheets is made of polyimide-based resin.

* * * * *